(12) United States Patent
Yamazaki et al.

(10) Patent No.: US 9,966,560 B2
(45) Date of Patent: May 8, 2018

(54) LIGHT-EMITTING MODULE, LIGHT-EMITTING DEVICE, AND METHOD FOR MANUFACTURING THE LIGHT-EMITTING MODULE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Satoshi Seo, Kanagawa (JP); Hideto Ohnuma, Kanagawa (JP); Hajime Kimura, Kanagawa (JP); Yasuhiro Jinbo, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 113 days.

(21) Appl. No.: 14/689,351

(22) Filed: Apr. 17, 2015

(65) Prior Publication Data

US 2015/0295203 A1 Oct. 15, 2015

Related U.S. Application Data

(63) Continuation of application No. 13/543,715, filed on Jul. 6, 2012, now Pat. No. 9,012,949.

(30) Foreign Application Priority Data

Jul. 8, 2011 (JP) ................................ 2011-151685

(51) Int. Cl.
*G02F 1/1339* (2006.01)
*H01L 51/52* (2006.01)
(Continued)

(52) U.S. Cl.
CPC ........ *H01L 51/5246* (2013.01); *G02F 1/1339* (2013.01); *G02F 1/1368* (2013.01);
(Continued)

(58) Field of Classification Search
None
See application file for complete search history.

(56) References Cited

U.S. PATENT DOCUMENTS 5,554,911 A 9/1996 Nakayama et al.
5,962,962 A 10/1999 Fujita et al.
(Continued)

FOREIGN PATENT DOCUMENTS

CN 001372434 A 10/2002
CN 001496543 A 5/2004
(Continued)

OTHER PUBLICATIONS

Kashiwabara.M et al., "29.5L: Late-News Paper: Advanced AM-OLED Display Based on White Emitter With Microcavity Structure", SID Digest '04 : SID International Symposium Digest of Technical Papers, 2004, vol. 35, pp. 1017-1019.
(Continued)

*Primary Examiner* — Richard Kim
(74) *Attorney, Agent, or Firm* — Nixon Peabody LLP; Jeffrey L. Costellia

(57) ABSTRACT

A highly reliable light-emitting module or light-emitting device is provided. A method for manufacturing a highly reliable light-emitting module is provided. The light-emitting module includes, between a first substrate and a second substrate, a first electrode provided over the first substrate, a second electrode provided over the first electrode with a layer containing a light-emitting organic compound interposed therebetween, and a sacrifice layer formed using a liquid material provided over the second electrode.

16 Claims, 9 Drawing Sheets

(51) Int. Cl.
*G02F 1/1335* (2006.01)
*G02F 1/1368* (2006.01)
*H01L 51/00* (2006.01)
*H01L 27/32* (2006.01)

(52) U.S. Cl.
CPC .. *G02F 1/133514* (2013.01); *G02F 1/133603* (2013.01); *H01L 27/322* (2013.01); *H01L 51/0096* (2013.01); *H01L 51/524* (2013.01); *H01L 51/5253* (2013.01); *H01L 27/3246* (2013.01); *H01L 2251/5315* (2013.01)

(56) References Cited

U.S. PATENT DOCUMENTS

| | | | |
|---|---|---|---|
| 5,990,615 | A | 11/1999 | Sakaguchi et al. |
| 6,605,826 | B2 | 8/2003 | Yamazaki et al. |
| 6,831,408 | B2 | 12/2004 | Hirano et al. |
| 6,847,163 | B1 | 1/2005 | Tsutsui et al. |
| 7,030,553 | B2 | 4/2006 | Winters et al. |
| 7,038,377 | B2 | 5/2006 | Kobayashi et al. |
| 7,045,822 | B2 | 5/2006 | Tsuchiya |
| 7,190,116 | B2 | 3/2007 | Kobayashi et al. |
| 7,202,504 | B2 | 4/2007 | Ikeda et al. |
| 7,211,828 | B2 | 5/2007 | Yamazaki et al. |
| 7,221,095 | B2 | 5/2007 | Yamazaki et al. |
| 7,230,271 | B2 | 6/2007 | Yamazaki et al. |
| 7,268,498 | B2 | 9/2007 | Miyagawa et al. |
| 7,271,537 | B2 | 9/2007 | Matsuda et al. |
| 7,291,969 | B2 | 11/2007 | Tsutsui |
| 7,317,282 | B2 | 1/2008 | Tsutsui et al. |
| 7,399,991 | B2 | 7/2008 | Seo et al. |
| 7,462,883 | B2 | 12/2008 | Kumaki et al. |
| 7,548,019 | B2 | 6/2009 | Omura et al. |
| 7,554,265 | B2 | 6/2009 | Godo et al. |
| 7,564,052 | B2 | 7/2009 | Kumaki |
| 7,579,774 | B2 | 8/2009 | Yamazaki et al. |
| 7,601,988 | B2 | 10/2009 | Seo et al. |
| 7,642,559 | B2 | 1/2010 | Yamazaki et al. |
| 7,663,149 | B2 | 2/2010 | Seo et al. |
| 7,701,134 | B2 | 4/2010 | Yamazaki et al. |
| 7,737,626 | B2 | 6/2010 | Kumaki et al. |
| 7,741,775 | B2 | 6/2010 | Yamazaki et al. |
| 7,753,751 | B2 | 7/2010 | Yamazaki |
| 7,851,989 | B2 | 12/2010 | Noda |
| 7,875,893 | B2 | 1/2011 | Seo et al. |
| 7,893,427 | B2 | 2/2011 | Kumaki et al. |
| RE42,215 | E | 3/2011 | Kobayashi et al. |
| 7,923,480 | B2 | 4/2011 | Fujita et al. |
| 7,956,349 | B2 | 6/2011 | Tsutsui et al. |
| 7,964,891 | B2 | 6/2011 | Kumaki et al. |
| 7,973,319 | B2 | 7/2011 | Kashiwabara et al. |
| 8,008,652 | B2 | 8/2011 | Kumaki et al. |
| 8,080,934 | B2 | 12/2011 | Kido et al. |
| 8,159,449 | B2 | 4/2012 | Kimura et al. |
| 8,227,809 | B2 | 7/2012 | Yamazaki et al. |
| 8,445,923 | B2 | 5/2013 | Lee |
| 8,502,440 | B2 | 8/2013 | Inoue et al. |
| 8,790,960 | B2 | 7/2014 | Yamazaki |
| 8,853,696 | B1 | 10/2014 | Yamazaki et al. |
| 9,012,249 | B2 | 4/2015 | Lee |
| 9,123,854 | B2 | 9/2015 | Yamazaki et al. |
| 2002/0024096 | A1 | 2/2002 | Yamazaki et al. |
| 2002/0085143 | A1* | 7/2002 | Kim ............... G02F 1/133603 349/61 |
| 2002/0113546 | A1 | 8/2002 | Seo et al. |
| 2003/0168966 | A1 | 9/2003 | Kobayashi et al. |
| 2003/0218422 | A1 | 11/2003 | Park et al. |
| 2005/0012454 | A1 | 1/2005 | Yamazaki et al. |
| 2005/0112408 | A1 | 5/2005 | Kobayashi et al. |
| 2005/0242746 | A1 | 11/2005 | Miyagawa et al. |
| 2006/0163597 | A1 | 7/2006 | Noda et al. |
| 2006/0267483 | A1 | 11/2006 | Tsutsui et al. |
| 2006/0284204 | A1 | 12/2006 | Yamazaki et al. |
| 2007/0001570 | A1 | 1/2007 | Nomura et al. |
| 2007/0176161 | A1 | 8/2007 | Seo et al. |
| 2007/0205718 | A1 | 9/2007 | Yamazaki et al. |
| 2007/0222911 | A1* | 9/2007 | Murase ............... G02F 1/13452 349/58 |
| 2008/0241586 | A1 | 10/2008 | Kumaki et al. |
| 2009/0045729 | A1 | 2/2009 | Fujita et al. |
| 2009/0275161 | A1 | 11/2009 | Kumaki et al. |
| 2009/0286445 | A1 | 11/2009 | Yamazaki et al. |
| 2010/0123152 | A1 | 5/2010 | Sugisawa et al. |
| 2010/0176720 | A1 | 7/2010 | Yamazaki |
| 2010/0244668 | A1 | 9/2010 | Nakamura et al. |
| 2011/0101345 | A1 | 5/2011 | Kumaki et al. |
| 2011/0101380 | A1 | 5/2011 | Kumaki et al. |
| 2011/0108864 | A1 | 5/2011 | Seo et al. |
| 2011/0140101 | A1 | 6/2011 | Noda |
| 2011/0241007 | A1 | 10/2011 | Kumaki et al. |
| 2011/0278562 | A1 | 11/2011 | Kumaki et al. |
| 2011/0291088 | A1 | 12/2011 | Seo et al. |
| 2011/0309351 | A1 | 12/2011 | Kumaki et al. |
| 2012/0299471 | A1 | 11/2012 | Yamazaki et al. |
| 2014/0306201 | A1* | 10/2014 | Yamazaki ........... H01L 51/5271 257/40 |
| 2014/0308777 | A1 | 10/2014 | Yamazaki |

FOREIGN PATENT DOCUMENTS

| | | |
|---|---|---|
| EP | 0781075 A | 6/1997 |
| EP | 1058311 A | 12/2000 |
| EP | 1450334 A | 8/2004 |
| EP | 1562231 A | 8/2005 |
| EP | 1717859 A | 11/2006 |
| EP | 1770779 A | 4/2007 |
| EP | 2273852 A | 1/2011 |
| EP | 2278639 A | 1/2011 |
| EP | 2434840 A | 3/2012 |
| JP | 05-036475 A | 2/1993 |
| JP | 05-041281 A | 2/1993 |
| JP | 06-275381 A | 9/1994 |
| JP | 09-035868 A | 2/1997 |
| JP | 10-275682 A | 10/1998 |
| JP | 11-097167 A | 4/1999 |
| JP | 2000-182769 A | 6/2000 |
| JP | 2001-043980 A | 2/2001 |
| JP | 2002-324673 A | 11/2002 |
| JP | 2004-014285 A | 1/2004 |
| JP | 2005-038833 A | 2/2005 |
| JP | 2005-093401 A | 4/2005 |
| JP | 2005-302738 A | 10/2005 |
| JP | 2006-032327 A | 2/2006 |
| JP | 2006-126817 A | 5/2006 |
| JP | 2006-228744 A | 8/2006 |
| JP | 2007-503093 | 2/2007 |
| JP | 2008-210788 A | 9/2008 |
| JP | 2008-305557 A | 12/2008 |
| JP | 4251286 | 4/2009 |
| JP | 2010-140980 A | 6/2010 |
| JP | 2010-153365 A | 7/2010 |
| JP | 2010-157515 A | 7/2010 |
| JP | 2011-029162 A | 2/2011 |
| KR | 2002-0068963 A | 8/2002 |
| KR | 2008-0091419 A | 10/2008 |
| TW | 201205684 | 2/2012 |
| WO | WO-2003/060858 | 7/2003 |
| WO | WO-2008/066122 | 6/2008 |
| WO | WO-2010/106853 | 9/2010 |
| WO | WO-2011/135987 | 11/2011 |

OTHER PUBLICATIONS

Matsumoto.T et al., "27.5L: Late-News Paper: Multiphoton Organic EL Device Having Charge Generation Layer", SID Digest '03 : SID International Symposium Digest of Technical Papers, 2003, vol. 34, pp. 979-981.

International Search Report (Application No. PCT/JP2012/067401) dated Aug. 7, 2012.

Written Opinion (Application No. PCT/JP2012/067401) dated Aug. 7, 2012.

(56) References Cited

OTHER PUBLICATIONS

Hung.L et al., "Application of an ultrathin LiF/Al bilayer in organic surface-emitting diodes", Appl. Phys. Lett. (Applied Physics Letters), Jan. 22, 2001, vol. 78, No. 4, pp. 544-546.

Kimura.M, "Hybrid Display using Liquid-Crystal Display and Organic Light-Emitting Diode", AM-LCD '05 Digest of Technical Papers, 2005, pp. 151-154.

Taiwanese Office Action (Application No. 101124266) dated May 11, 2016.

* cited by examiner

LIGHT-EMITTING MODULE, LIGHT-EMITTING DEVICE, AND METHOD FOR MANUFACTURING THE LIGHT-EMITTING MODULE

TECHNICAL FIELD

The present invention relates to a light-emitting module including a light-emitting element, a light-emitting device including the light-emitting module, and a method for manufacturing the light-emitting module.

BACKGROUND ART

Mobile phones, personal computers, smartphones, e-book readers, and the like have come into widespread use, and the length of time display devices are used in our lives has increased. Since these electronic devices are now in popular use, they are also used for simple work which has conventionally been done with paper and stationery. Specifically, schedule management, address list management, making notes, and the like which have conventionally been done with a notebook are now done with multifunctional electronic devices typified by smartphones.

For most of these electronic devices, a display panel in which display elements are arranged in matrix is used. As the display element, an element which controls transmission of light (e.g., a liquid crystal display element), an element which controls reflection of light (e.g., an element using an electrophoretic method), a light-emitting element which emits light by itself, or the like is used.

A light-emitting element in which a layer containing a light-emitting organic compound (also referred to as an EL layer) which has a film shape is provided between a pair of electrodes is known. Such a light-emitting element is called, for example, an organic EL element, and light emission can be obtained from the layer containing a light-emitting organic compound when voltage is applied between the pair of electrodes. Lighting devices and light-emitting devices used for display each including an organic EL element are known. An example of a display device including an organic EL element is disclosed in Patent Document 1.

REFERENCE

Patent Document

[Patent Document 1] Japanese Published Patent Application No. 2002-324673

DISCLOSURE OF INVENTION

The reliability of a light-emitting element in which a layer containing a light-emitting organic compound is provided between a pair of electrodes tends to be reduced in the environment in which impurities in the air (such as water and/or oxygen) exist.

An embodiment of the present invention is made in view of the foregoing technical background. It is an object of an embodiment of the present invention to provide a light-emitting module with high reliability. In addition, it is an object to provide a light-emitting device with high reliability. In addition, it is an object to provide a method for manufacturing a light-emitting module with high reliability.

In order to achieve the above objects, attention has been focused on a sacrifice layer formed using a liquid material in an embodiment of the present invention. A structure including, between a first substrate and a second substrate, a first electrode provided over the first substrate, a second electrode provided over the first electrode with a layer containing a light-emitting organic compound interposed therebetween, and a sacrifice layer formed using a liquid material and provided over the second electrode has been made to achieve the above objects.

That is, an embodiment of the present invention is a light-emitting module including a first substrate, a second substrate facing the first substrate, and a light-emitting element between the first substrate and the second substrate. The light-emitting element includes a first electrode provided over the first substrate, a second electrode overlapping with the first electrode, and a layer containing a light-emitting organic compound between the first electrode and the second electrode, the second electrode is in contact with a sacrifice layer formed by a coating method, and the sacrifice layer contains a material which reacts with or adsorbs impurities.

The light-emitting module according to an embodiment of the present invention has a structure including the sacrifice layer in contact with the second electrode. The sacrifice layer contains a material which reacts with or adsorbs impurities (such as water and/or oxygen) and is formed by a coating method (also referred to as a wet method). Accordingly, impurities which reduce the reliability of the light-emitting element preferentially react with or are preferentially adsorbed by the material contained in the sacrifice layer and become inactive. As a result, a light-emitting module with high reliability can be provided.

In addition, an embodiment of the present invention is the light-emitting module, in which the second electrode and the second substrate transmit light emitted from the layer containing a light-emitting organic compound, and the second electrode and the second substrate are optically connected by the sacrifice layer.

The light-emitting module according to an embodiment of the present invention has a structure in which the second electrode and the second substrate are optically connected by the sacrifice layer. Accordingly, a drastic change in the refractive index (also referred to as a step portion in the refractive index) of light of the light-emitting element can be suppressed in a light path from the second electrode to the second substrate, whereby light of the light-emitting element can be efficiently extracted to the second substrate through the second electrode. As a result, the emission efficiency of the light-emitting module can be improved, and a light-emitting module with high reliability can be provided.

In addition, an embodiment of the present invention is the light-emitting module, further including a partition covering an end portion of the first electrode and including an opening overlapping with the first electrode. The thickness of a region of the sacrifice layer which overlaps with the partition is smaller than a thickness of a region of the sacrifice layer which overlaps with the opening.

In the light-emitting module according to an embodiment of the present invention, stray light is suppressed owing to the thin sacrifice layer over the partition. As a result, the emission efficiency of the light-emitting module can be improved, and a light-emitting module with high reliability can be provided.

In addition, an embodiment of the present invention is the light-emitting module according to any of the above, in which the sacrifice layer contains a material used for the light-emitting element.

In the light-emitting module according to an embodiment of the present invention, impurities (such as water and/or oxygen) which reduce the reliability of the light-emitting element preferentially react with or are preferentially adsorbed by the material contained in the sacrifice layer, which is also used for the light-emitting element. Consequently, the impurities become inactive before reaching the light-emitting element. As a result, a light-emitting module with high reliability can be provided.

In addition, an embodiment of the present invention is the light-emitting module according to any of the above, in which a sealant surrounding the light-emitting element attaches the first substrate and the second substrate to each other.

The light-emitting module according to an embodiment of the present invention includes the light-emitting element which is surrounded by the sealant and overlaps with the sacrifice layer. The sealant inhibits impurities (such as water and/or oxygen) which reduce the reliability of the light-emitting element from entering the light-emitting module. The impurities preferentially react with or are preferentially adsorbed by the material contained in the sacrifice layer and become inactive. As a result, a light-emitting module with high reliability can be provided.

In addition, an embodiment of the present invention is the light-emitting module, in which the sealant surrounding the sacrifice layer attaches the first substrate and the second substrate to each other.

The light-emitting module according to an embodiment of the present invention has a structure in which the first substrate and the second substrate are attached to each other with the sealant which surrounds the light-emitting element and the sacrifice layer without overlapping with the sacrifice layer. Since the sealant does not overlap with the sacrifice layer, the air does not enter the light-emitting module through the sacrifice layer. As a result, a light-emitting module with high reliability can be provided.

In addition, an embodiment of the present invention is the light-emitting module, in which the sacrifice layer is liquid.

The light-emitting module according to an embodiment of the present invention includes the liquid sacrifice layer in a space surrounded by the first substrate, the second substrate, and the sealant. By using the liquid sacrifice layer, the sacrifice layer can be evenly provided. In addition, since the sacrifice layer is surrounded by the sealant, the liquid sacrifice layer is prevented from leaking. As a result, a light-emitting module with high reliability can be provided.

In addition, an embodiment of the present invention is the light-emitting module according to any of the above, in which the sacrifice layer is solid.

In the light-emitting module according to an embodiment of the present invention, since the sacrifice layer is solid, the speed of diffusion of impurities (such as water and/or oxygen) is low. As a result, a light-emitting module with high reliability can be provided.

In addition, an embodiment of the present invention is the light-emitting module, in which the sacrifice layer attaches the first substrate and the second substrate to each other.

In the light-emitting module according to an embodiment of the present invention, the first substrate and the second substrate are attached to each other with the sacrifice layer; thus, it is not necessary to provide a sealant. As a result, a highly reliable light-emitting module can be easily provided.

In addition, an embodiment of the present invention is the light-emitting module according to any of the above, wherein the second substrate is flexible.

In the light-emitting module according to an embodiment of the present invention, the second substrate having flexibility can be deformed in accordance with the sacrifice layer, so that a space is not easily formed between the sacrifice layer and the second substrate. As a result, the emission efficiency of the light-emitting module can be improved, and a light-emitting module with high reliability can be provided.

In addition, an embodiment of the present invention is a method for manufacturing a light-emitting module, including: a first step of forming a first electrode over a first substrate, forming a partition covering an end portion of the first electrode and including an opening overlapping with the first electrode, forming a layer containing a light-emitting organic compound having one surface in contact with the first electrode in the opening of the partition, and forming a second electrode in contact with the other surface of the layer containing a light-emitting organic compound to overlap with the opening of the partition, thereby forming a light-emitting element; a second step of forming a coating liquid layer containing a material which reacts with or adsorbs impurities over the second electrode of the light-emitting element and forming a sealant surrounding the light-emitting element over the second substrate; and a third step of attaching the first substrate and the second substrate to each other with the sealant so that the light-emitting element is interposed between the first substrate and the second substrate.

In accordance with the method for manufacturing a light-emitting module according to an embodiment of the present invention, a sacrifice layer can be formed in contact with the second electrode by a coating method (also referred to as a wet method). In addition, the thickness of a region of the sacrifice layer which overlaps with the partition can be smaller than the thickness of a region of the sacrifice layer which overlaps with the opening. As a result, the emission efficiency of the light-emitting module can be improved, and a method for manufacturing a light-emitting module with high reliability can be provided.

In addition, an embodiment of the present invention is the method for manufacturing a light-emitting module, in which in the second step, after applying the sacrifice layer, energy is applied to the sacrifice layer to harden the sacrifice layer.

In accordance with the method for manufacturing a light-emitting module according to an embodiment of the present invention, the sacrifice layer can be formed in contact with the second electrode by a coating method (also referred to as a wet method). In addition, a solid sacrifice layer in which diffusion of impurities (such as water and/or oxygen) is suppressed can be formed. As a result, a method for manufacturing a light-emitting module with high reliability can be provided.

In addition, an embodiment of the present invention is the method for manufacturing a light-emitting module, in which in the third step, after the first substrate and the second substrate are attached to each other, energy is applied to the sacrifice layer to harden the sacrifice layer.

In accordance with the method for manufacturing a light-emitting module according to an embodiment of the present invention, the sacrifice layer can be formed in contact with the second electrode by a coating method (also referred to as a wet method). In addition, the solid sacrifice layer in which diffusion of impurities is suppressed can be formed. As a result, a method for manufacturing a light-emitting module with high reliability can be provided.

In addition, an embodiment of the present invention is a method for manufacturing a light-emitting module, including: a first step of forming a first electrode over a first substrate, forming a partition covering an end portion of the first electrode and including an opening overlapping with the first electrode, forming a layer containing a light-emitting organic compound having one surface in contact with the first electrode in the opening of the partition, and forming a second electrode in contact with the other surface of the layer containing a light-emitting organic compound to overlap with the opening of the partition, thereby forming a light-emitting element; a second step of forming a first sealant including an opening and surrounding the light-emitting element over the second substrate, and attaching the first substrate and the second substrate to each other with the first sealant so that the light-emitting element is interposed between the first substrate and the second substrate; a third step of injecting a coating liquid layer containing a material which reacts with or adsorbs impurities to a space between the first substrate and the second substrate from the opening; and a fourth step of filling the opening with a second sealant.

In accordance with the method for manufacturing a light-emitting module according to an embodiment of the present invention, the sacrifice layer can be formed in contact with the second electrode by a coating method (also referred to as a wet method). As a result, a method for manufacturing a light-emitting module with high reliability can be provided.

Note that in this specification, an "EL layer" refers to a layer provided between a pair of electrodes in a light-emitting element. Thus, a light-emitting layer containing an organic compound that is a light-emitting substance which is interposed between electrodes is an embodiment of the EL layer.

In this specification, in the case where a substance A is dispersed in a matrix formed using a substance B, the substance B forming the matrix is referred to as a host material, and the substance A dispersed in the matrix is referred to as a guest material. Note that the substance A and the substance B may each be a single substance or a mixture of two or more kinds of substances.

Note that a light-emitting device in this specification means an image display device, a light-emitting device, or a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted over a substrate over which a light-emitting element is formed by a COG (chip on glass) method.

In accordance with embodiments of the present invention, a highly reliable light-emitting module, a highly reliable light-emitting device, and a method for manufacturing the highly reliable light-emitting module can be provided.

BEST MODE FOR CARRYING OUT THE INVENTION

Figure 1A:
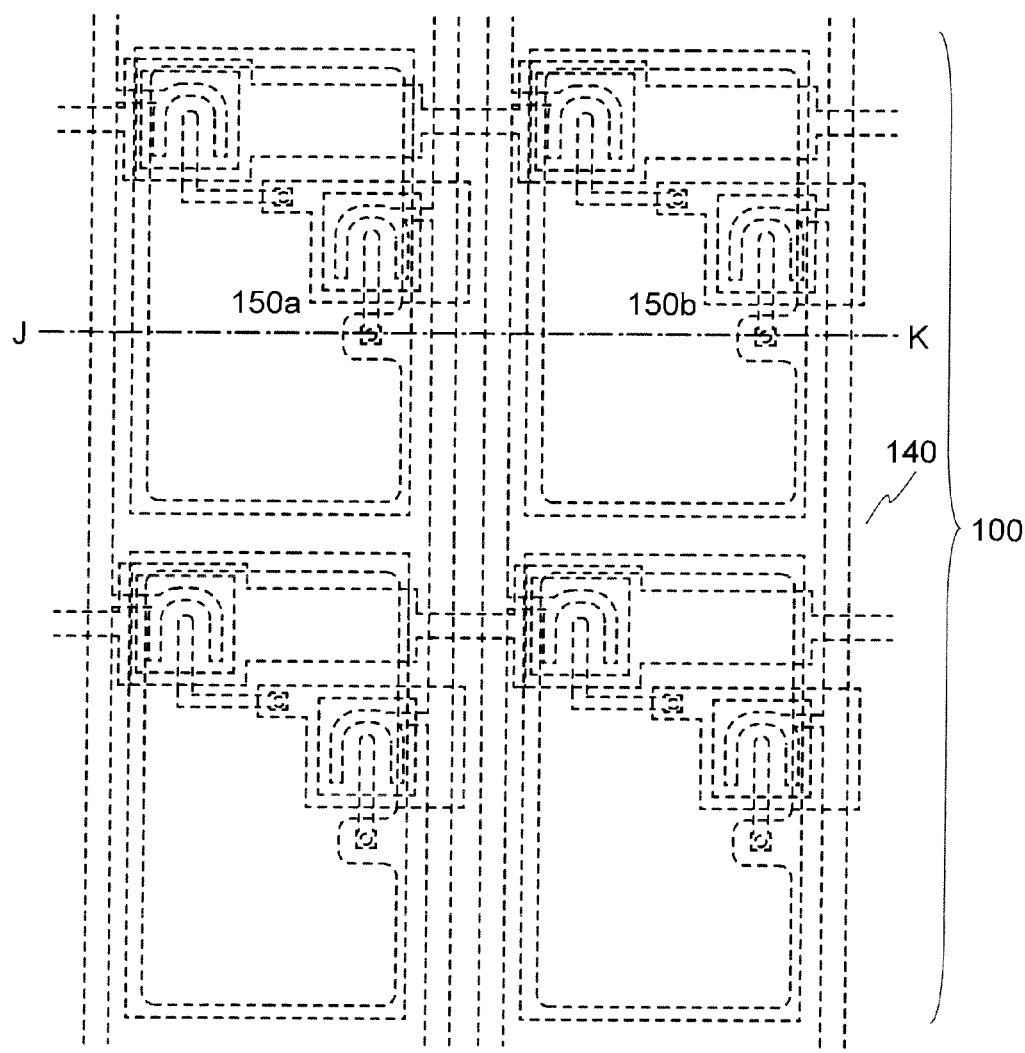
FIGS. 1A and 1B illustrate a structure of a light-emitting module and a light-emitting panel according to an embodiment.

Embodiments will be described in detail with reference to the drawings. Note that the present invention is not limited to the following description, and it will be easily understood by those skilled in the art that modes and details thereof can be variously changed without departing from the spirit and the scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Embodiment 1

Figure 1B:
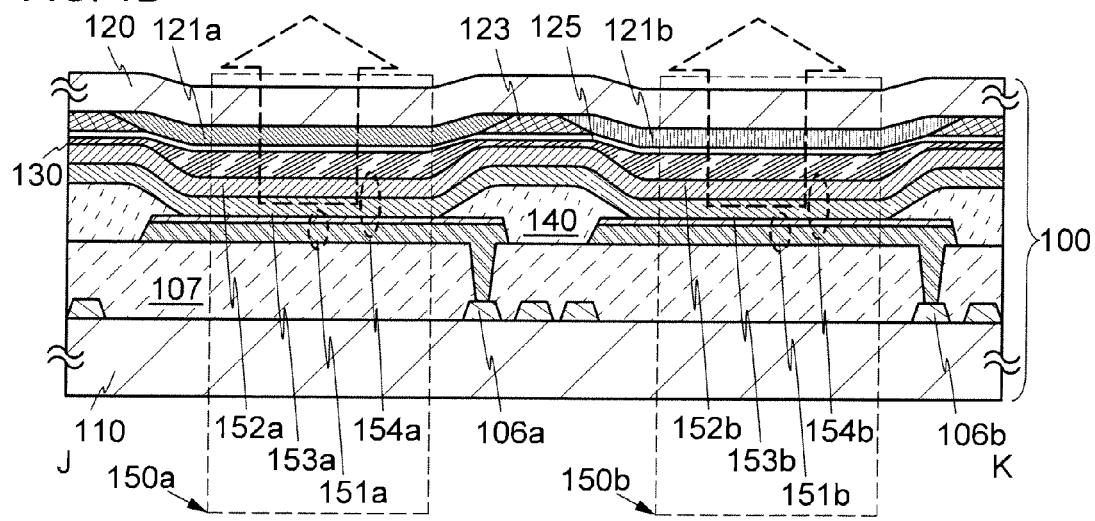

In this embodiment, the structure of a light-emitting module according to an embodiment of the present invention will be described with reference to FIGS. 1A and 1B and FIG. 2. The light-emitting module according to an embodiment of the present invention includes, between a first substrate and a second substrate, a first electrode provided over the first substrate, a second electrode provided over the first electrode with a layer containing a light-emitting organic compound interposed therebetween, and a sacrifice layer formed using a liquid material provided over the second electrode. Specifically, a light-emitting panel in which a plurality of light-emitting modules are provided adjacent each other is described as an example.

The light-emitting module according to an embodiment of the present invention has a structure including the sacrifice layer in contact with the second electrode. The sacrifice layer contains a material which reacts with or adsorbs impurities (such as water and/or oxygen) and is formed by a coating method (also referred to as a wet method). Accordingly, impurities which reduce the reliability of the light-emitting element preferentially react with or are preferentially adsorbed by the material contained in the sacrifice layer and become inactive. As a result, a light-emitting module with high reliability can be provided.

The light-emitting module has a structure in which the second electrode having a light-transmitting property and the second substrate having a light-transmitting property are optically connected by the sacrifice layer. Accordingly, a drastic change in the refractive index (also referred to as a step portion in the refractive index) of light of the light-emitting element can be suppressed in a light path from the second electrode to the second substrate, whereby light of the light-emitting element can be efficiently extracted to the second substrate through the second electrode. As a result, the emission efficiency of the light-emitting module can be improved, and a light-emitting module with high reliability can be provided.

In the light-emitting module according to an embodiment of the present invention, stray light is suppressed owing to a thin sacrifice layer over a partition. As a result, the emission efficiency of the light-emitting module can be improved, and a light-emitting module with high reliability can be provided.

<Structure of Light-Emitting Panel Including a Plurality of Light-Emitting Modules>

The structure of a light-emitting panel including light-emitting modules according to an embodiment of the present invention will be described with reference to FIGS. 1A and 1B. FIG. 1A is a top view of the light-emitting panel including light-emitting modules according to an embodiment of the present invention, and FIG. 1B is a cross-sectional view along line J-K in FIG. 1A. A light-emitting panel 100 illustrated in FIG. 1B emits light in the direction denoted by arrows in the drawing.

The light-emitting panel 100 includes a first light-emitting module 150a and a second light-emitting module 150b. The first light-emitting module 150a includes a first light-emitting element 154a between a first substrate 110 and a second substrate 120. The second light-emitting module 150b includes a second light-emitting element 154b between the first substrate 110 and the second substrate 120.

A conductive layer including a conductive layer 106a and a conductive layer 106b is provided over the first substrate 110, and an insulating layer 107 is provided over the conductive layer. An opening reaching the conductive layer 106a and an opening reaching the conductive layer 106b are formed in the insulating layer 107.

A first electrode 151a and a first electrode 151b are provided adjacent to each other over the insulating layer 107. The first electrode 151a is electrically connected to the conductive layer 106a through the opening, and the first electrode 151b is electrically connected to the conductive layer 106b through the opening. A partition 140 has openings overlapping with the first electrode 151a and the first electrode 151b. In addition, the partition 140 covers end portions of the first electrode 151a and the first electrode 151b.

A second electrode 152a is provided in a position overlapping with the first electrode 151a. The first electrode 151a, the second electrode 152a, and a layer 153a containing a light-emitting organic compound interposed therebetween form the first light-emitting element 154a. A second electrode 152b is provided in a position overlapping with the first electrode 151b. The first electrode 151b, the second electrode 152b, and a layer 153b containing a light-emitting organic compound interposed therebetween form the second light-emitting element 154b. Light emitted from the layer 153a containing a light-emitting organic compound passes through the second electrode 152a, and light emitted from the layer 153b containing a light-emitting organic compound passes through the second electrode 152b.

The second substrate 120 is provided with a first optical filter 121a in a position overlapping with the first electrode 151a and a second optical filter 121b in a position overlapping with the first electrode 151b. Note that a light-blocking layer 123 may be provided so as to overlap with the partition 140 which separates the adjacent first electrodes. An overcoat layer 125 may be provided so as to overlap with the first optical filter 121a, the second optical filter 121b, and the light-blocking layer 123.

The first light-emitting module 150a includes the first light-emitting element 154a and the first optical filter 121a stacked between the first substrate 110 and the second substrate 120. The second light-emitting module 150b includes the second light-emitting element 154b and the second optical filter 121b stacked between the first substrate 110 and the second substrate 120.

A sacrifice layer 130 is provided between the first substrate 110 and the second substrate 120 in the light-emitting modules according to an embodiment of the present invention. Specifically, the first light-emitting module 150a includes the sacrifice layer 130 between the second electrode 152a and the first optical filter 121a. The second light-emitting module 150b includes the sacrifice layer 130 between the second electrode 152b and the second optical filter 121b. Further, the sacrifice layer 130 is provided between the partition 140 and the light-blocking layer 123.

In this embodiment, the first light-emitting module 150a in the light-emitting panel 100 includes the first electrode 151a which reflects light emitted from the layer 153a containing a light-emitting organic compound, the second electrode 152a which transmits the light, and the first optical filter 121a which transmits part of the light. The second light-emitting module 150b in the light-emitting panel 100 includes the first electrode 151b which reflects light emitted from the layer 153b containing a light-emitting organic compound, the second electrode 152b which transmits the light, and the second optical filter 121b which transmits part of the light.

<Sacrifice Layer>

The sacrifice layer 130 is in contact with the second electrodes and contains a material which reacts with or adsorbs impurities (such as water and/or hydrogen) which reduce the reliability of the light-emitting element, Impurities preferentially react with or are preferentially adsorbed by the material contained in the sacrifice layer and become inactive before reducing the reliability of the light-emitting element. As a result, a light-emitting module with high reliability can be provided.

A material which can be used for the sacrifice layer 130 is not limited to a particular material as long as the material can be liquid, can be applied on the second electrodes to form the sacrifice layer 130, and contains a material which reacts with or adsorbs impurities which reduce the reliability of the light-emitting element.

For the sacrifice layer 130, a material that can be used for an EL layer (one or more of a substance having a high hole-transport property, a light-emitting substance, a host material, a substance having a high electron-transport property, a substance having a high electron-injection property, an accepter substance, and the like) can be used. Impurities which reduce the reliability of the light-emitting element react with or are adsorbed by the material added to the sacrifice layer which can be used for the EL layer, and become inactive before reducing the reliability of the light-emitting element. As a result, a light-emitting module with high reliability can be provided.

Specific examples of a material which can be used for the sacrifice layer 130 include a conductive high molecule, poly(3,4-ethylenedioxythiophene)/poly(styrenesulfonic acid) (PEDOT/PSS), a desiccating agent, a material which can be used as a light-emitting organic compound, 4,4'-bis[N-(1-naphthyl)-N-phenylamino]biphenyl (abbreviation: NPB or α-NPD), and tris(8-quinolinolato)aluminum(III) (abbreviation: Alq). The material which can be used as a light-emitting organic compound will be described in detail in Embodiment 4.

In the structure in which the sacrifice layer 130 is formed in contact with the second electrodes and the second substrate, the sacrifice layer 130 can optically connect the second electrodes and the second substrate. Accordingly, a drastic change in the refractive index (also referred to as a step portion in the refractive index) of light of the light-emitting element can be suppressed in a light path from the second electrode to the second substrate, whereby light of the light-emitting element can be efficiently extracted to the second substrate through the second electrode. As a result, the emission efficiency of the light-emitting module can be improved, and current to achieve a predetermined luminance can be reduced, so that a light-emitting module with high reliability can be provided.

The thickness of a region of the sacrifice layer 130 which overlaps with the opening of the partition 140 (also referred to as a region which overlaps with a light-emitting region of the light-emitting element) is large, and the thickness of a region of the sacrifice layer 130 which overlaps with the partition 140 is small. As a result, stray light is suppressed, and the emission efficiency of the light-emitting module can be improved, so that a light-emitting module with high reliability can be provided.

A surface of the sacrifice layer 130 which is in contact with the second substrate 120 has gentle unevenness with projections with a small height. Specifically, the region which overlaps with the opening of the partition 140 (also referred to as the region which overlaps with the light-emitting region of the light-emitting element) is depressed, and the region which overlaps with the partition 140 is projected. The second substrate is deformed in accordance with the unevenness of the sacrifice layer 130, so that the second substrate of the light-emitting panel becomes uneven in some cases.

When a flexible substrate is used as the second substrate, since the second substrate can be deformed in accordance with the sacrifice layer, a space is not easily formed between the sacrifice layer and the second substrate. As a result, the emission efficiency of the light-emitting module can be improved, and a light-emitting module with high reliability can be provided.

A material which can be used for the sacrifice layer 130 can be liquid and can be applied on the second electrode to form the sacrifice layer 130, so that such a structure can be achieved. A method for forming the sacrifice layer 130 will be described in detail in Embodiment 3.

<First Substrate>

The first substrate 110 has heat resistance high enough to resist the manufacturing process. The first substrate 110 may have a single-layer structure or a layered structure including two or more layers. There is no particular limitation on the thickness and the size of the first substrate 110 as long as the substrate can be used in a manufacturing apparatus.

A surface of the first substrate 110 over which the light-emitting element is formed preferably has an insulating property. Alternatively, an insulating film may be stacked over the first substrate 110.

The surface of the first substrate 110 over which the light-emitting element is formed is preferably flat. Alternatively, a film for planarization may be stacked over the first substrate 110.

The first substrate 110 preferably has a gas barrier property. Alternatively, a film having a gas barrier property may be stacked over the first substrate 110. Specifically, when the first substrate 110 has such a gas barrier property that the vapor permeability is lower than or equal to $10^{-5}$ g/m$^2$·day, preferably lower than or equal to $10^{-6}$ g/m$^2$·day, the reliability of the light-emitting module can be improved, which is preferable.

For example, as a substrate which can be used as the first substrate 110, a non-alkali glass substrate, a barium borosilicate glass substrate, an aluminoborosilicate glass substrate, a ceramic substrate, a quartz substrate, a sapphire substrate, a metal substrate, a stainless-steel substrate, a plastic substrate, a polyethylene terephthalate substrate, a polyimide substrate, or the like can be used.

In this embodiment, a structure in which a non-alkali glass substrate is used as the first substrate 110 is described.

<Conductive Layer>

The conductive layers 106a and 106b have conductivity. The conductive layers 106a and 106b may each have a single-layer structure of a layer containing a conductive material or a layered structure including two or more layers each containing a conductive material. There is no particular limitation on the thickness of the conductive layers 106a and 106b.

As the conductive material, any conductive material may be used as long as it has conductivity and can withstand the manufacturing process. For example, a metal selected from molybdenum, titanium, tantalum, tungsten, aluminum, copper, chromium, neodymium, scandium, and the like, or an alloy containing the metal can be used.

A metal nitride can be used as the conductive material. Specific examples of the metal nitride include titanium nitride, molybdenum nitride, and tungsten nitride.

Alternatively, a conductive metal oxide can be used as the conductive material. Specifically, indium oxide, tin oxide, indium tin oxide (also referred to as ITO), indium zinc oxide, zinc oxide, zinc oxide to which gallium or aluminum is added, or the metal oxide material which contains silicon oxide can be used.

Alternatively, graphene or the like can be used as the conductive material.

In this embodiment, a structure in which a stack obtained by stacking titanium over an aluminum alloy is used as the conductive layers 106a and 106b is described.

<Insulating Film>

The insulating layer 107 has an insulating property. The insulating layer 107 may have a single-layer structure or a layered structure including two or more layers. There is no particular limitation on the thickness of the insulating layer 107.

Note that a surface of the insulating layer 107 is preferably flat. This is because when the surface of the insulating layer 107 is uneven, a surface of the first electrode also becomes uneven, which might cause a short circuit between the first electrode and the second electrode.

A material which can be used for the insulating layer 107 preferably has an insulating property and preferably resists the manufacturing process; for example, one insulating layer selected from a silicon oxide layer, a silicon oxynitride layer, an aluminum oxide layer, an acrylic resin layer, a polyimide resin layer, a benzocyclobutene resin layer, a polyamide resin layer, an epoxy resin layer, a siloxane-based resin layer, an SOG layer, a polysilazane-based SOG layer, and the like, or a layer including any of the insulating layers can be used.

In this embodiment, a structure in which a polyimide layer is used as the insulating layer 107 is described.

<First Electrode>

The first electrode 151a and the first electrode 151b each contain a conductive material. The first electrode 151a and the first electrode 151b may each have a single-layer structure or a layered structure including two or more layers. There is no particular limitation on the thickness thereof.

As the conductive material, any conductive material may be used as long as it has conductivity and can withstand the manufacturing process. For example, a metal selected from molybdenum, titanium, tantalum, tungsten, aluminum, silver, copper, chromium, neodymium, scandium, and the like, or an alloy containing the metal can be used.

Examples of the alloy containing aluminum include an aluminum-nickel-lanthanum alloy, an aluminum-titanium alloy, and an aluminum-neodymium alloy. Examples of the alloy containing silver include a silver-neodymium alloy and a magnesium-silver alloy. In addition, an alloy containing gold and copper can be used.

A metal nitride can be used as the conductive material. Specific examples of the metal nitride include titanium nitride, molybdenum nitride, and tungsten nitride.

Alternatively, a conductive metal oxide can be used as the conductive material. Specifically, indium oxide, tin oxide, indium tin oxide (also referred to as ITO), indium zinc oxide, zinc oxide, zinc oxide to which gallium or aluminum is added, or the metal oxide material which contains silicon oxide can be used.

In this embodiment, a layered structure in which a layer containing titanium is stacked over a layer containing an aluminum-nickel-lanthanum alloy is used for the first electrode 151a and the first electrode 151b. The aluminum-nickel-lanthanum alloy has high reflectivity and can suppress a phenomenon in which an oxide film having high resistance is formed on the surface of the first electrodes owing to the layer containing titanium. As a result, loss of intensity of light emitted from the light-emitting element and loss of electric power due to electric resistance can be reduced.

A transistor may be formed over the first substrate 110, and a source electrode or a drain electrode of the transistor may be electrically connected to the first electrode 151a through the conductive layer 106a or to the first electrode 151b through the conductive layer 106b. With such a structure, a light-emitting device in which each light-emitting module can independently emit light can be provided, and the light-emitting device can be applied to a display device, for example.

<Partition>

The partition 140 contains an insulating material. The partition 140 may have a single-layer structure or a layered structure including two or more layers. There is no particular limitation on the thickness thereof. The partition 140 is preferably formed so as to have a curved surface with curvature at an upper end portion or a lower end portion.

The partition 140 may be formed using a material which has an insulating property and can resist the manufacturing process. For example, an insulating layer formed of a material selected from photopolymer, photosensitive acrylic, photosensitive polyimide, and the like, or an insulating layer containing the material can be used.

In this embodiment, the partition 140 is formed using positive photosensitive polyimide and has a curved surface having a radius of curvature of greater than or equal to 0.2 μm and less than or equal to 3 μm at an upper end portion.

<Layer Containing Light-Emitting Organic Compound>

The first layer 153a containing a light-emitting organic compound and the second layer 153b containing a light-emitting organic compound each contain at least a light-emitting organic compound. The first layer 153a containing a light-emitting organic compound and the second layer 153b containing a light-emitting organic compound may each have a single-layer structure or a layered structure including two or more layers. Note that a structure of the layer containing a light-emitting organic compound will be described in detail in Embodiment 4.

In this embodiment, a layer which emits white light is used as each of the first layer 153a containing a light-emitting organic compound and the second layer 153b containing a light-emitting organic compound.

<Second Electrode>

The second electrode 152a and the second electrode 152b each contain a conductive material. The second electrode 152a and the second electrode 152b may each have a single-layer structure or a layered structure including two or more layers.

As the conductive material, any conductive material may be used as long as it has conductivity and can withstand the manufacturing process. For example, a metal selected from aluminum, silver, and the like, or an alloy containing the metal can be used.

Examples of the alloy containing aluminum include an aluminum-nickel-lanthanum alloy, an aluminum-titanium alloy, and an aluminum-neodymium alloy. Examples of the alloy containing silver include a silver-neodymium alloy and a magnesium-silver alloy. In addition, an alloy containing gold and copper can be used.

A metal nitride can be used as the conductive material. Specific examples of the metal nitride include titanium nitride, molybdenum nitride, and tungsten nitride.

Alternatively, a conductive metal oxide can be used as the conductive material. Specifically, indium oxide, tin oxide, indium tin oxide (also referred to as ITO), indium zinc oxide, zinc oxide, zinc oxide to which gallium or aluminum is added, or the metal oxide material which contains silicon oxide can be used.

In this embodiment, a layered structure in which an indium tin oxide layer containing silicon oxide is stacked over a magnesium-silver alloy layer is used as each of the second electrode 152a and the second electrode 152b. Since the work function of the magnesium-silver alloy layer is low, the magnesium-silver alloy layer is excellent in electron-injection property and conductivity, crystallization of the indium tin oxide layer containing silicon oxide can be suppressed, and the transmittance with respect to light emitted from the layer containing a light-emitting organic compound is high. As a result, loss of intensity of light emitted from the light-emitting element and loss of electric power due to electric resistance can be reduced.

<Optical Filter>

The first optical filter 121a and the second optical filter 121b each include a layer which transmits at least part of light emitted from the layer containing a light-emitting organic compound. The first optical filter 121a and the second optical filter 121b may each have a single-layer structure or a layered structure including two or more layers. There is no particular limitation on the thickness of the first optical filter 121a and the second optical filter 121b.

A material which can be used for the layer that transmits at least part of light emitted from the layer containing a light-emitting organic compound may be a material which can resist the manufacturing process. For example, an organic material layer containing a coloring material or a multilayer filter can be used.

As the organic material layer containing a coloring material, a layer which transmits red light, a layer which transmits green light, or a layer which transmits blue light can be given.

In this embodiment, one layer selected from a layer which transmits red light, a layer which transmits green light, and a layer which transmits blue light is used for the first optical filter 121a and another layer selected from them is used for the second optical filter 121b.

<Light-Blocking Layer>

The light-blocking layer 123 includes a layer which blocks light that passes through the second substrate 120. The light-blocking layer 123 may have a single-layer structure or a layered structure including two or more layers.

The layer which blocks light that passes through the second substrate 120 is preferably formed using a material which inhibits light that passes through the second substrate 120 from entering the light-emitting module and can resist the manufacturing process. For example, one light-blocking layer selected from a chromium layer, a titanium layer, a nickel layer, a high molecular layer in which carbon black is dispersed, and the like can be used.

In this embodiment, a high molecular layer in which carbon black is dispersed is used as the light-blocking layer 123.

<Overcoat Layer>

The overcoat layer 125 includes a layer for planarizing the surface and preventing diffusion of impurities (such as water and/or oxygen). The overcoat layer 125 may have a single-layer structure or a layered structure including two or more layers. There is no particular limitation on the thickness of the overcoat layer 125.

The layer for planarizing the surface and preventing diffusion of impurities relieves unevenness of the surface of the optical filter, suppresses diffusion of impurities contained in the optical filter and/or the light-blocking layer to the side provided with the light-emitting element, or suppresses diffusion of impurities which pass through the optical filter and/or the light-blocking layer to the side provided with the light-emitting element. The layer for planarizing the surface and preventing diffusion of impurities may be formed using a material which can resist the manufacturing process. For example, an overcoat layer selected from a polyimide layer, an epoxy layer, an acrylic layer, and the like, or an overcoat layer including one of them can be used. Such an overcoat layer may be either a thermosetting type or an ultraviolet curing type.

In this embodiment, the case of using polyimide for the overcoat layer is described.

<Second Substrate>

The second substrate 120 may have a single-layer structure or a layered structure including two or more layers as long as it has heat resistance high enough to resist the manufacturing process. There is no particular limitation on the thickness and the size of the second substrate 120 as long as the substrate can be used in a manufacturing apparatus.

The second substrate 120 preferably has a gas barrier property. Alternatively, a film having a gas barrier property may be stacked over the second substrate 120. Specifically, when the second substrate 120 has such a gas barrier property that the vapor permeability is lower than or equal to $10^{-5}$ g/m$^2$·day, preferably lower than or equal to $10^{-6}$ g/m$^2$·day, the reliability of the light-emitting module can be improved, which is preferable.

The second substrate 120 is preferably flexible. As a flexible substrate, a plastic substrate can be typically given as an example. In addition, a thin glass substrate with a thickness of greater than or equal to 50 μm and less than or equal to 500 μm can be used. In the case where light is not extracted to the second substrate 120 side, a metal foil can be used as the second substrate 120.

For example, as a substrate which can be used as the second substrate 120, a non-alkali glass substrate, a barium borosilicate glass substrate, an aluminoborosilicate glass substrate, a ceramic substrate, a quartz substrate, a sapphire substrate, a metal substrate, a stainless-steel substrate, a plastic substrate, a polyethylene terephthalate substrate, a polyimide substrate, or the like can be used.

In this embodiment, a structure in which a non-alkali glass substrate is used as the second substrate 120 is described.

<Structure of Multicolor Light-Emitting Panel>

Next, a multicolor light-emitting panel using the light-emitting panel having the above structure will be described. For example, one of two light-emitting elements which emit light of different colors may be applied to the first light-emitting module 150a, and the other may be applied to the second light-emitting module 150b. Specifically, a light-emitting element emitting light of a color selected from blue, red, and green may be applied to the first light-emitting element 154a and a light-emitting element emitting light of another color selected from them may be applied to the second light-emitting element 154b.

The two light-emitting elements emitting light of different colors may be formed in such a manner that a layer containing a light-emitting organic compound which emits light of one color and a layer containing a light-emitting organic compound which emits light of another color are provided in the first light-emitting element 154a and the second light-emitting element 154b, respectively. Note that a structure of the layer containing a light-emitting organic compound will be described in detail in Embodiment 4.

Note that a microresonator (also referred to as a microcavity) may be formed by forming one of the first and second electrodes as a reflective electrode and the other as a semi-transmissive and semi-reflective electrode to adjust a distance (optical distance) between the first electrode and the second electrode, and light with a particular wavelength may be efficiently extracted through the semi-transmissive and semi-reflective electrode.

Alternatively, two optical filters transmitting light of different colors may be selected, and one of them may be applied to the first optical filter 121a and the other may be applied to the second optical filter 121b. Specifically, an optical filter transmitting light of one color of blue, red, and green may be applied to the first optical filter 121a and an optical filter transmitting light of another color of blue, red, and green may be applied to the second optical filter 121b.

When two optical filters transmitting light of different colors are selected, the first and second light-emitting elements 154a and 154b may each be a light-emitting element which emits white light.

Modification Example

The structure of a light-emitting panel which includes light-emitting modules according to an embodiment of the present invention and is different from the light-emitting panel illustrated in FIGS. 1A and 1B will be described with reference to a cross-sectional view in FIG. 2. A light-emitting panel 100 illustrated in FIG. 2 is different from the light-emitting panel 100 illustrated in FIGS. 1A and 1B in the direction in which light is extracted. Specifically, in the light-emitting panel 100 illustrated in FIG. 2, light is extracted to the first substrate 110 side.

Figure 2:
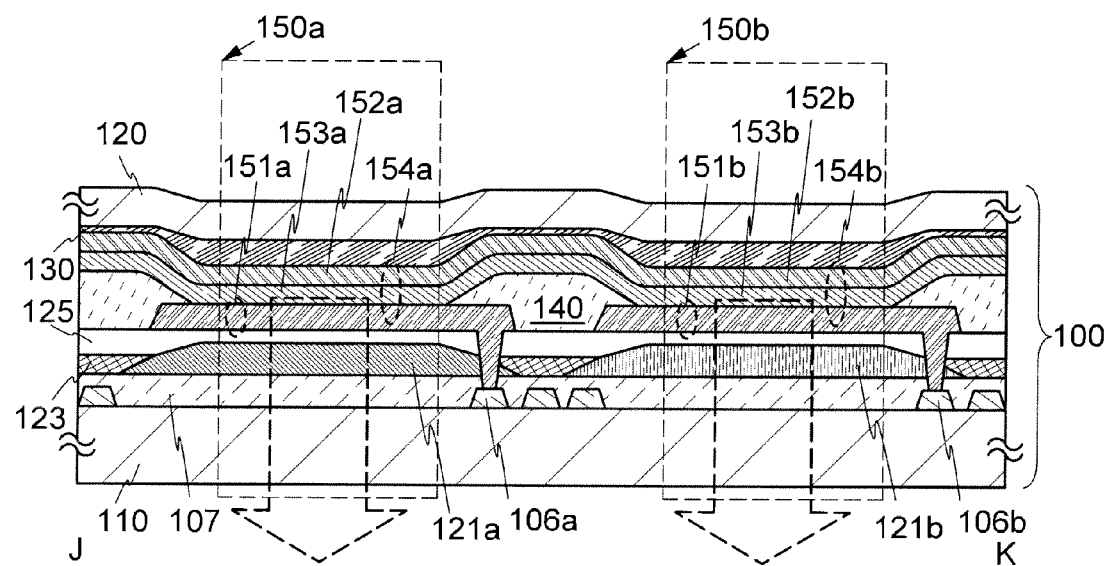
FIG. 2 illustrates a structure of a light-emitting module and a light-emitting panel according to an embodiment.

The light-emitting panel 100 illustrated in FIG. 2 includes a first light-emitting module 150a and a second light-emitting module 150b. The first light-emitting module 150a includes a first light-emitting element 154a between a first substrate 110 and a second substrate 120. The second light-emitting module 150b includes a second light-emitting element 154b between the first substrate 110 and the second substrate 120.

The first light-emitting element 154a includes a layer 153a containing a light-emitting organic compound between a first electrode 151a and a second electrode 152a. The second light-emitting element 154b includes a layer 153b containing a light-emitting organic compound between a first electrode 151b and a second electrode 152b.

A sacrifice layer 130 is provided between the first substrate 110 and the second substrate 120 in the light-emitting modules according to an embodiment of the present invention illustrated in FIG. 2. Specifically, the first light-emitting module 150a includes the sacrifice layer 130 between the second electrode 152a and the second substrate 120, and the second light-emitting module 150b includes the sacrifice layer 130 between the second electrode 152b and the second substrate 120. Further, the sacrifice layer 130 is provided between a partition 140 and the second substrate 120.

The first light-emitting module 150a in the light-emitting panel 100 described in this modification example includes the second electrode 152a which reflects light emitted from the layer 153a containing a light-emitting organic compound, the first electrode 151a which transmits the light, and a first optical filter 121a which transmits part of the light. The second light-emitting module 150b in the light-emitting panel 100 includes the second electrode 152b which reflects light emitted from the layer 153b containing a light-emitting organic compound, the first electrode 152b which transmits the light, and a second optical filter 121b which transmits part of the light.

The light-emitting module according to an embodiment of the present invention described in this embodiment has a structure including the sacrifice layer in contact with the second electrode. The sacrifice layer contains a material which reacts with or adsorbs impurities (such as water and/or oxygen) and is formed by a coating method (also referred to as a wet method). Impurities which reduce the reliability of the light-emitting element preferentially react with or are preferentially adsorbed by the material contained in the sacrifice layer and become inactive. As a result, a light-emitting module with high reliability can be provided.

In the light-emitting module according to an embodiment of the present invention, stray light is suppressed owing to the thin sacrifice layer over the partition. As a result, the emission efficiency of the light-emitting module can be improved, and a light-emitting module with high reliability can be provided.

This embodiment can be combined with any of the other embodiments in this specification as appropriate.

Embodiment 2

In this embodiment, a light-emitting module will be described with reference to FIGS. 3A to 3C and FIGS. 4A and 4B. The light-emitting module includes, between a first substrate and a second substrate, a first electrode provided over the first substrate, a second electrode provided over the first electrode with a layer containing a light-emitting organic compound interposed therebetween, and a sacrifice layer formed using a liquid material provided over the second electrode. Specifically, a light-emitting panel in which a plurality of light-emitting modules are provided adjacent to each other will be described.

Figure 3A:
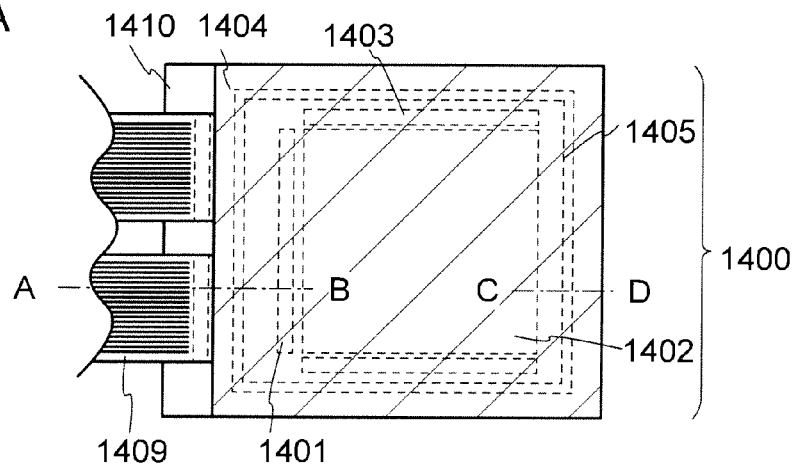
FIGS. 3A to 3C illustrate a structure of a light-emitting module and a light-emitting panel according to an embodiment.
Figure 3B:
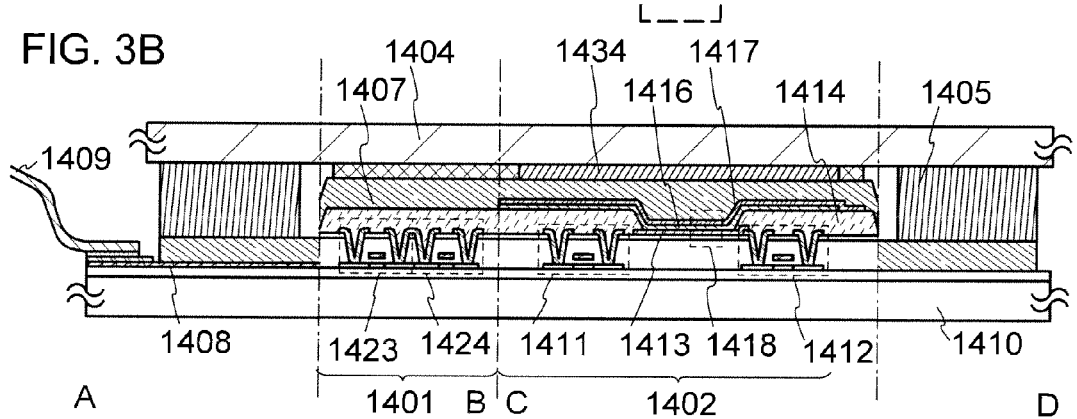
Figure 3C:
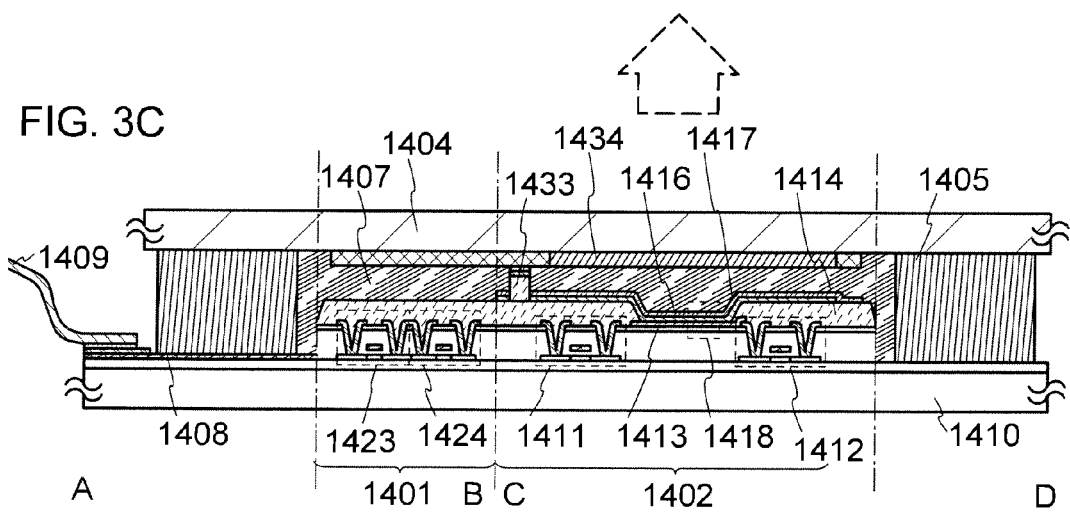

In the light-emitting module described in this embodiment, the first substrate and the second substrate are attached to each other with a sealant surrounding a light-emitting element (see FIGS. 3A to 3C). The sealant prevents impurities (such as water and/or oxygen) which reduce the reliability of the light-emitting element from entering the light-emitting module. In addition, the impurities which have entered preferentially react with or are preferentially adsorbed by a material contained in the sacrifice layer and become inactive. As a result, a light-emitting module with high reliability can be provided.

In the light-emitting module described in this embodiment, the sacrifice layer is surrounded by the sealant which attaches the first substrate and the second substrate to each other (see FIG. 3C). In addition, in the light-emitting module according to an embodiment of the present invention, the sealant surrounds the light-emitting element and the sacrifice layer without overlapping with the sacrifice layer, and the first substrate and the second substrate are attached to each other with the sealant. Since the sealant and the sacrifice layer do not overlap with each other, the air does not enter the light-emitting module through the sacrifice layer. As a result, a light-emitting module with high reliability can be provided.

The sacrifice layer included in the light-emitting module described in this embodiment may be liquid (see FIG. 3C). When the sacrifice layer is liquid, the sacrifice layer can flow and can be evenly provided. In addition, since the sacrifice layer is surrounded by the sealant, the liquid sacrifice layer is prevented from leaking. As a result, a light-emitting module with high reliability can be provided.

Note that the liquid sacrifice layer can be formed using liquid which does not dissolve the light-emitting element; for example, a liquid crystal material or a fluorine-based inactive liquid (such as perfluorocarbon) can be used. These materials may be used after impurities which reduce the reliability of the light-emitting element are removed therefrom. In addition, a material which reacts with or adsorbs the impurities may be dispersed in the above materials.

The sacrifice layer included in the light-emitting module described in this embodiment may be solid. When the sacrifice layer is a solid, the speed of diffusion of impurities is low. As a result, a light-emitting module with high reliability can be provided.

Figure 4A:
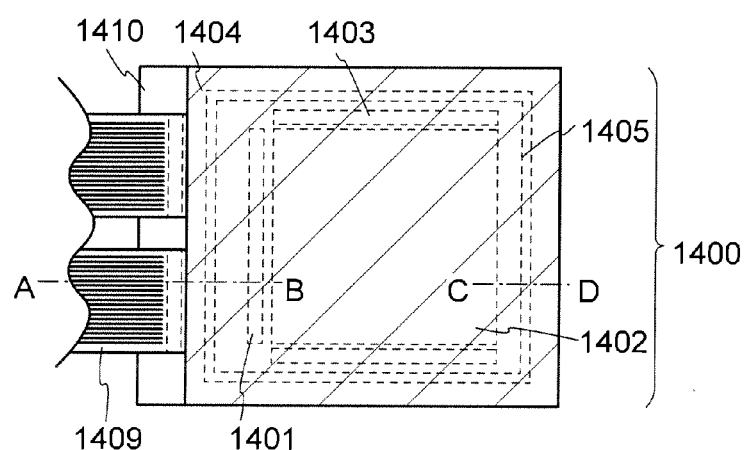
FIGS. 4A and 4B illustrate a structure of a light-emitting module and a light-emitting panel according to an embodiment.
Figure 4B:
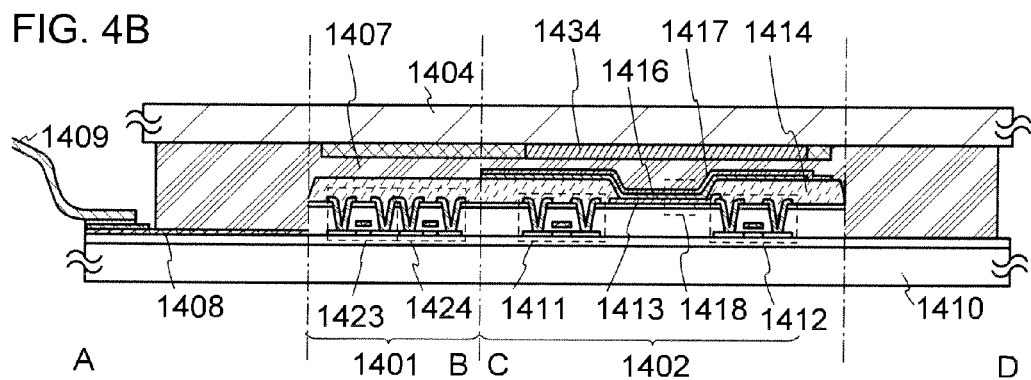

In the light-emitting module described in this embodiment, the first substrate and the second substrate are attached to each other with the sacrifice layer (see FIGS. 4A and 4B). Since the first substrate and the second substrate are attached to each other with the sacrifice layer, it is not necessary to provide a sealant. As a result, a light-emitting module with high reliability can be easily provided.

In this embodiment, an active matrix light-emitting device in which the light-emitting module according to an embodiment of the present invention is connected to a transistor is described; however, an embodiment of the present invention is not limited to the active matrix light-emitting device and can also be applied to a passive matrix light-emitting device, a display device, or a lighting device.

<Active Matrix Light-Emitting Device>

FIGS. 3A to 3C illustrate the structure of an active matrix light-emitting device to which the light-emitting module is applied. Note that FIG. 3A is a top view of the light-emitting device, and FIG. 3B is a cross-sectional view taken along lines A-B and C-D in FIG. 3A. A light-emitting device 1400 illustrated in FIG. 3B emits light in the direction denoted by an arrow in the drawing.

The active matrix light-emitting device 1400 includes a driver circuit portion (source driver circuit) 1401, a pixel portion 1402, a driver circuit portion (gate driver circuit)

1403, a second substrate 1404, and a sealant 1405 (see FIG. 3A). Note that a portion surrounded by the sealant 1405 is a space.

The light-emitting device 1400 receives a video signal, a clock signal, a start signal, a reset signal, and the like from an FPC (flexible printed circuit) 1409 that is an external input terminal. Note that only the FPC is illustrated here; however, the FPC may be provided with a printed wiring board (PWB). The light-emitting device in this specification includes, in its category, not only the light-emitting device itself but also the light-emitting device provided with the FPC or the PWB.

Next, the structure of the light-emitting device 1400 will be described with reference to the cross-sectional view of FIG. 3B. The light-emitting device 1400 includes, over a first substrate 1410, a driver circuit portion including the source driver circuit 1401 illustrated and the pixel portion 1402 including a pixel illustrated. Further, the light-emitting device 1400 includes a lead wiring 1408 for transmitting signals that are to be input to the source driver circuit 1401 and the gate driver circuit 1403.

Note that although the source driver circuit 1401 includes a CMOS circuit in which an n-channel transistor 1423 and a p-channel transistor 1424 are combined in this embodiment, the driver circuit is not limited to this structure and may be any of a variety of circuits, such as a CMOS circuit, a PMOS circuit, or an NMOS circuit. Although this embodiment illustrates a driver-integrated type in which the driver circuit is formed over the substrate, the present invention is not limited to this, and the driver circuit may be formed outside the substrate, not over the substrate.

<Structure of Transistor>

Note that any of a variety of semiconductors can be used for a region where a channel of a transistor is formed. Specifically, as well as amorphous silicon, polysilicon, or single crystal silicon, an oxide semiconductor or the like can be used.

When a single crystal semiconductor is used for a region where a channel of a transistor is formed, the size of the transistor can be reduced, which results in higher resolution pixels in a display portion.

As a single crystal semiconductor used for forming a semiconductor layer, a semiconductor substrate, typical examples of which include a single crystal semiconductor substrate formed using elements belonging to Group 14, such as a single crystal silicon substrate, a single crystal germanium substrate, or a single crystal silicon germanium substrate, and a compound semiconductor substrate (e.g., a SiC substrate, a sapphire substrate, and a GaN substrate), can be used. Preferred one is a silicon on insulator (SOI) substrate in which a single crystal semiconductor layer is provided on an insulating surface.

An SOI substrate can be formed by the following method or the like: after oxygen ions are implanted into a mirror-polished wafer, the wafer is heated at high temperatures to form an oxide layer at a predetermined depth from a surface of the wafer and eliminate defects generated in a surface layer. Alternatively, an SOI substrate can be formed by a method in which a semiconductor substrate is separated by utilizing the growth of microvoids formed by hydrogen ion irradiation due to heat treatment. Alternatively, an SOI substrate can be formed by a method in which a single crystal semiconductor layer is formed on an insulating surface by crystal growth.

In this embodiment, ions are added through one surface of a single crystal semiconductor substrate, an embrittlement layer is formed at a certain depth from the one surface of the single crystal semiconductor substrate, and an insulating layer is formed over the one surface of the single crystal semiconductor substrate or over the first substrate 1410. Heat treatment is performed in a state where the single crystal semiconductor substrate and the first substrate 1410 are bonded to each other with the insulating layer interposed therebetween, so that a crack is generated in the embrittlement layer and the single crystal semiconductor substrate is separated along the embrittlement layer. Thus, a single crystal semiconductor layer, which is separated from the single crystal semiconductor substrate, is formed as a semiconductor layer over the first substrate 1410. Note that a glass substrate can be used as the first substrate 1410.

Regions electrically insulated from each other may be formed in the semiconductor substrate, and transistors 1411 and 1412 may be formed using the regions electrically insulated from each other.

The use of the single crystal semiconductor as a channel formation region can reduce variation in the electric characteristics of a transistor, such as threshold voltage, due to a bonding defect at a crystal grain boundary. Hence, in the light-emitting device according to an embodiment of the present invention, the light-emitting element can operate normally without providing a circuit for compensating the threshold voltage in each pixel. The number of circuit elements per pixel can therefore be reduced, increasing the flexibility in layout. Thus, a high-resolution light-emitting device can be achieved. For example, a light-emitting device having a matrix of a plurality of pixels, specifically 350 or more pixels per inch (i.e., the horizontal resolution is 350 or more pixels per inch (ppi)), preferably 400 or more pixels per inch (i.e., the horizontal resolution is 400 or more ppi) can be achieved.

Moreover, a transistor whose channel formation region is composed of a single crystal semiconductor can be downsized while keeping high current drive capability. The use of the downsized transistor leads to a reduction in the area of the circuit area that does not contribute to display operation, resulting in an increase in the area of a region of the display portion where an image is displayed and a reduction in the frame size of the light-emitting device.

<Structure of Pixel Portion>

The pixel portion 1402 includes a plurality of pixels. Each pixel includes a light-emitting element 1418, the current control transistor 1412 whose drain electrode is connected to a first electrode 1413 of the light-emitting element 1418, and the switching transistor 1411.

The light-emitting element 1418 provided in the light-emitting panel includes the first electrode 1413, a second electrode 1417, and a layer 1416 containing a light-emitting organic compound. Note that a partition 1414 is formed so as to cover an end portion of the first electrode 1413.

Further, the partition 1414 is formed such that either an upper end portion or a lower end portion thereof has a curved surface with a curvature. The partition 1414 can be formed using either a negative photosensitive resin which becomes insoluble in an etchant by light irradiation or a positive photosensitive resin which becomes soluble in an etchant by light irradiation. For example, in the case of using positive photosensitive acrylic as a material for the partition 1414, it is preferable that the partition 1414 be formed so as to have a curved surface with a radius of curvature (0.2 μm to 3 μm) only at the upper end portion thereof. Here, the partition 1414 is formed using a positive photosensitive polyimide film.

When the partition 1414 is made to block light, reflection of external light due to a reflective film provided in the light-emitting panel can be suppressed. When a reflective film which extends outside the light-emitting element 1418 reflects external light, the contrast of the light-emitting device is lowered; for that reason, bright light emission cannot be obtained. When the partition is made to block light, it can be formed using a resin layer colored with black.

As a structure of the light-emitting element 1418, a structure of the light-emitting element exemplified in Embodiment 4 can be employed, for example.

Specifically, a structure in which the layer 1416 containing a light-emitting organic compound emits white light can be employed.

A color filter 1434 can be provided in a position overlapping with the light-emitting element 1418. In addition, a light-blocking film (also referred to as a black matrix) can be provided to overlap with the partition between the adjacent light-emitting elements. The color filter 1434 and the light-blocking film can be provided over the second substrate 1404.

By using the first electrode 1413 and the second electrode 1417 of the light-emitting element 1418, a microresonator (also referred to as a microcavity) can be formed. For example, the first electrode 1413 is formed using a conductive film which reflects light emitted from the layer 1416 containing a light-emitting organic compound, and the second electrode 1417 is formed using a semi-transmissive and semi-reflective conductive film which reflects part of the light and transmits part of the light.

In addition, an optical adjustment layer can be provided between the first electrode and the second electrode. The optical adjustment layer adjusts the optical path length between the reflective first electrode 1413 and the semi-transmissive and semi-reflective second electrode 1417. By adjusting the thickness of the optical adjustment layer, the wavelength of light which is preferentially extracted through the second electrode 1417 can be controlled.

The layer containing a light-emitting organic compound can be employed for a material that can be used for the optical adjustment layer. For example, the thickness of the optical adjustment layer can be controlled by using a charge generation region. Specifically, a region containing a substance having a high hole-transport property and an acceptor substance is preferably used for the optical adjustment layer because an increase in drive voltage can be suppressed even when the optical adjustment layer is thick.

A light-transmitting conductive film which transmits light emitted from the layer 1416 containing a light-emitting organic compound can also be employed for a material that can be used for the optical adjustment layer. For example, the light-transmitting conductive film is stacked over a surface of the reflective conductive film to form the first electrode 1413. This structure is preferable because the thicknesses of the optical adjustment layers over the adjacent first electrodes can be easily varied.

<Sealing Structure 1>

The light-emitting device 1400 exemplified in this embodiment has a structure in which the light-emitting element 1418 is sealed in a space surrounded by the first substrate 1410, the second substrate 1404, and the sealant 1405.

The space is filled with a sacrifice layer 1407. The space may be filled with the sacrifice layer 1407 without a gap, or part of the space may remain without being filled. The part of the space which remains may be filled with an inert gas (such as nitrogen or argon) or the sealant 1405. In addition, a material for adsorbing impurities (such as water and/or oxygen), such as a desiccating agent, may be provided.

The sealant 1405 and the second substrate 1404 are desirably formed using a material which does not transmit impurities in the air (such as water and/or oxygen) as much as possible. An epoxy-based resin, glass frit, or the like can be used for the sealant 1405.

Examples of the second substrate 1404 include a glass substrate; a quartz substrate; a plastic substrate formed of polyvinyl fluoride (PVF), polyester, acrylic, or the like; a substrate of fiberglass-reinforced plastics (FRP); and the like.

In the light-emitting device illustrated in FIG. 3B, the sacrifice layer 1407 covers the light-emitting element 1418, and the first substrate and the second substrate are attached to each other with the sealant 1405 which surrounds the light-emitting element 1418. The sealant 1405 prevents impurities which reduce the reliability of the light-emitting element 1418 from entering the light-emitting module. In addition, the impurities which have entered preferentially react with or are preferentially adsorbed by the material contained in the sacrifice layer 1407 and become inactive. As a result, a light-emitting module with high reliability can be provided.

<Sealing Structure 2>

The structure of a light-emitting device which is different from that of the light-emitting device illustrated in FIG. 3B will be described with reference to FIG. 3C. In the light-emitting module included in the light-emitting device illustrated in FIG. 3C, the sacrifice layer is surrounded by the sealant which attaches the first substrate and the second substrate to each other. Since the sealant and the sacrifice layer do not overlap with each other, the air does not enter the light-emitting module through the sacrifice layer. As a result, a light-emitting module with high reliability can be provided.

The sacrifice layer included in the light-emitting module described in this embodiment may be liquid. When the sacrifice layer is liquid, the sacrifice layer can flow and can be evenly provided. In addition, since the sacrifice layer is surrounded by the sealant, the liquid sacrifice layer is prevented from leaking. As a result, a light-emitting module with high reliability can be provided.

The sacrifice layer included in the light-emitting module described in this embodiment may be solid. When the sacrifice layer is a solid, the speed of dispersion of impurities is low. As a result, a light-emitting module with high reliability can be provided.

A spacer 1433 may be provided over the partition 1414. The spacer 1433 may be a sphere or a column. With the spacer 1433 provided over the partition 1414, a phenomenon in which the second substrate 1404 bent due to external force damages the light-emitting element 1418 can be prevented.

<Sealing Structure 3>

The structure of a light-emitting device which is different from that of the light-emitting device illustrated in FIG. 3B or 3C is described with reference to FIGS. 4A and 4B. In the light-emitting module included in the light-emitting device illustrated in FIGS. 4A and 4B, the sacrifice layer attaches the first substrate and the second substrate to each other. Since the first substrate and the second substrate are attached to each other with the sacrifice layer, it is not necessary to provide a sealant. As a result, a light-emitting module with high reliability can be easily provided.

The light-emitting module according to an embodiment of the present invention includes, between a first substrate and a second substrate, a first electrode provided over the first substrate, a second electrode provided over the first electrode with a layer containing a light-emitting organic compound interposed therebetween, and a sacrifice layer formed using a liquid material provided over the second electrode.

In the light-emitting module described in this embodiment, the first substrate and the second substrate are attached to each other with the sacrifice layer. Since the first substrate and the second substrate are attached to each other with the sacrifice layer, it is not necessary to provide a sealant. As a result, a light-emitting module with high reliability can be easily provided.

This embodiment can be combined with any of the other embodiments as appropriate.

Embodiment 3

In this embodiment, a method for manufacturing a light-emitting module according to an embodiment of the present invention will be described by exemplifying the case of manufacturing a light-emitting device including a light-emitting panel in which a plurality of light-emitting modules are provided adjacent to each other. Specifically, a method for manufacturing a light-emitting module including, between a first substrate and a second substrate, a first electrode provided over the first substrate, a second electrode provided over the first electrode with a layer containing a light-emitting organic compound interposed therebetween, and a sacrifice layer formed using a liquid material provided over the second electrode will be described with reference to FIGS. 5A to 5C and FIGS. 6A to 6C.
<First Step>

A single crystal semiconductor layer is formed over a first substrate 1410 in the following manner. Ions are added through one surface of a single crystal semiconductor substrate to form an embrittlement layer at a predetermined depth. In addition, an insulating film is formed over one surface of the first substrate 1410. The single crystal semiconductor substrate and the first substrate 1410 are attached to each other with the insulating layer interposed therebetween, heat treatment is performed, and a crack is generated in the embrittlement layer. The single crystal semiconductor substrate is separated at the embrittlement layer, so that the single crystal semiconductor layer is formed over the first substrate 1410.

Transistors each including the single crystal semiconductor layer as a channel formation region, i.e., an n-channel transistor 1423 and a p-channel transistor 1424, are formed in a source driver circuit 1401. A current control transistor 1412 and a switching transistor 1411 are formed in a pixel portion 1402.

An insulating layer covering the transistors is formed, and a wiring layer is folioed over the insulating layer, and a source electrode or a drain electrode of the transistor is connected to the wiring layer through an opening provided in the insulating layer.

A conductive film for forming a first electrode 1413 is formed to be electrically connected to the source electrode or the drain electrode of the transistor 1412, and the conductive film is processed into an island shape, so that the first electrode 1413 is formed.

Then, an insulating partition 1414 is formed so as to cover an end portion of the first electrode 1413 and have an opening overlapping with the first electrode 1413.

Figure 5A:
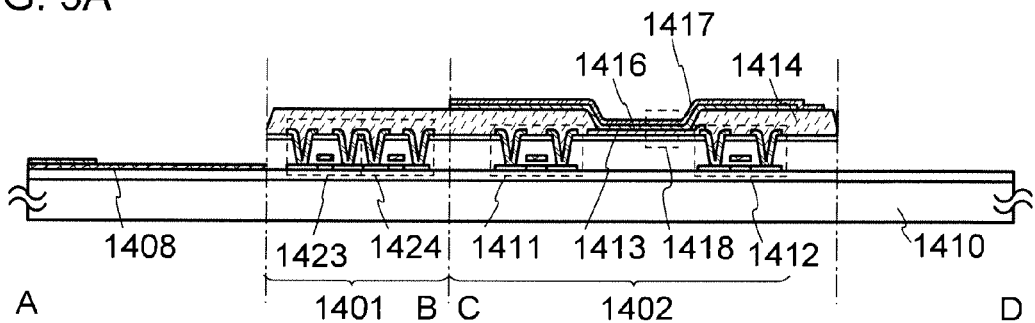
FIGS. 5A to 5C illustrate a method for manufacturing a light-emitting module and a light-emitting panel according to an embodiment.
Figure 5B:
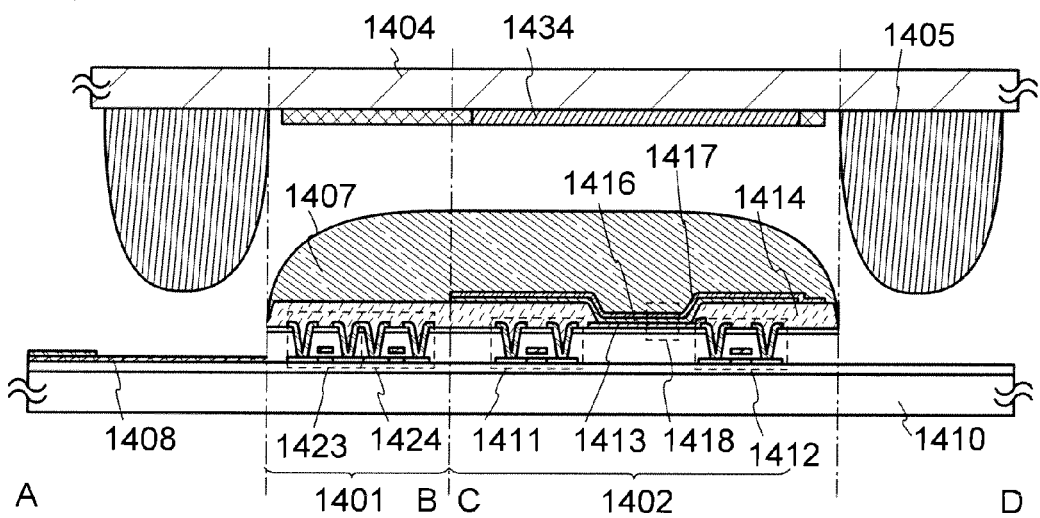
Figure 5C:
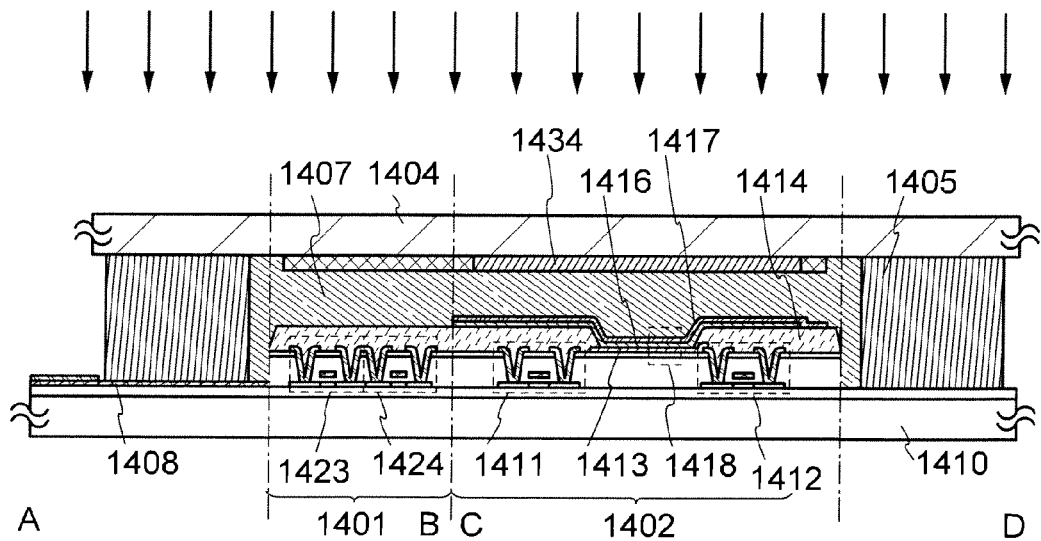

Next, a layer 1416 containing a light-emitting organic compound is formed to be in contact with the first electrode 1413 in the opening of the partition 1414, and a second electrode 1417 is formed in contact with a surface of the layer 1416 containing a light-emitting organic compound, which is not the surface in contact with the first electrode 1413 and to overlap with the opening of the partition 1414, whereby a light-emitting element 1418 is formed (see FIG. 5A).

In this embodiment, the case where a light-emitting element which emits white light is applied to the light-emitting element 1418 is described. The structure and the manufacturing method of the light-emitting element which emits white light will be described in Embodiment 4.
<Second Step>

Then, a sacrifice layer 1407 is formed over the second electrode 1417. The sacrifice layer 1407 is formed by a coating method (also referred to as a wet method).

By a coating method, the sacrifice layer 1407 is formed by applying liquid in which a material is dissolved or dispersed. A coating method refers to a method in which a liquid material having fluidity is formed on the surface of a substrate, specifically, a spin coating method, a printing method, a coat method, a dipping method, a dispenser method, an inkjet method, or the like. In the second step, liquid in which a material that reacts with or adsorbs impurities (such as water and/or oxygen) is dispersed is applied on the second electrode 1417.

A coating liquid is prepared in such a manner that a material which reacts with or adsorbs impurities (such as water and/or oxygen) is dissolved or dispersed in a solvent or a disperse from which impurities are removed. The solvent or the disperse may be volatile or reactive. With a coating liquid using a volatile solvent (such as an organic solvent), the solid sacrifice layer 1407 can be formed by heating or a reduction in pressure. With a coating liquid using a reactive solvent (such as a monomer), the solid sacrifice layer 1407 can be formed by energy (such as heating or UV ray irradiation).

In this embodiment, the sacrifice layer 1407 is formed using a dispenser. A container (such as a syringe) capable of quantification is filled with a coating liquid. Then, the container (such as a syringe) capable of quantification is connected to a dispenser.

In the environment from which impurities are removed (specifically, the dew point is lower than or equal to −70° C.), the quantified coating liquid is dripped on the second electrode using the dispenser, so that a coating liquid layer with a desired thickness is formed.

In addition, a sealant 1405 surrounding the light-emitting element 1418 is formed over a surface of the second substrate 1404 which is provided with a color filter 1434 and a light-blocking film (see FIG. 5B).
<Third Step>

The first substrate 1410 and the second substrate 1404 are attached to each other with the sealant 1405 so that the light-emitting element 1418 is interposed therebetween. When a reactive material is used for the sealant 1405, energy for hardening (such as heat or UV rays) may be applied so as not to damage the light-emitting element (see FIG. 5C).

Modification Example 1 of Manufacturing Method

In order to obtain the solid sacrifice layer 1407, in the second step, energy (such as heat or UV rays) is applied to the coating liquid layer so that the coating liquid layer can become a solid.

Specifically, when the coating liquid layer contains a volatile solvent (such as an organic solvent), the first substrate provided with the coating liquid layer is heated or the pressure around the first substrate is reduced so as to volatilize the solvent, whereby the coating liquid layer can be a solid. In addition, by adjusting the amount of the solvent to be volatilized, the fluidity of the coating liquid layer may be adjusted.

In addition, when the coating liquid layer contains a reactive solvent (such as a monomer), the first substrate provided with the coating liquid layer is heated or the pressure around the first substrate is reduced so as to harden the solvent, whereby the coating liquid layer can be a solid. In addition, by adjusting the hardening reaction of the coating liquid layer, the fluidity of the coating liquid layer may be adjusted.

Through the above method, by solidifying the coating liquid layer or adjusting the fluidity thereof, a solid sacrifice layer in which diffusion of impurities (such as water and/or oxygen) is suppressed can be formed. In addition, the amount of the solvent remaining in the sacrifice layer can be adjusted. As a result, a method for manufacturing a highly reliable light-emitting module can be provided.

Modification Example 2 of Manufacturing Method

In order to obtain the solid sacrifice layer 1407, in the third step, energy (such as heat or UV rays) is applied to the coating liquid layer so that the coating liquid layer can become a solid.

Specifically, when the coating liquid layer contains a volatile solvent (such as an organic solvent), the first substrate provided with the coating liquid layer is heated or the pressure around the first substrate is reduced so as to volatilize the solvent, whereby the coating liquid layer can be a solid. In addition, by adjusting the amount of the solvent to be volatilized, the fluidity of the coating liquid layer may be adjusted.

In the case of using the above method, since the volatile solvent is released from the coating liquid layer, an opening may be provided in the sealant 1405. When the opening is provided in the sealant 1405, it is preferable to form a second sealant which fills the opening after the third step.

In addition, when the coating liquid layer contains a reactive solvent (such as a monomer), the first substrate provided with the coating liquid layer is heated or the pressure around the first substrate is reduced so as to harden the solvent, whereby the coating liquid layer can be a solid. In addition, by adjusting the hardening reaction of the coating liquid layer, the fluidity of the coating liquid layer may be adjusted.

Through the above method, by solidifying the coating liquid layer or adjusting the fluidity thereof, a solid sacrifice layer in which diffusion of impurities (such as water and/or oxygen) is suppressed can be formed. In addition, the amount of the solvent remaining in the sacrifice layer can be adjusted. As a result, a method for manufacturing a highly reliable light-emitting module can be provided.

Modification Example 3 of Manufacturing Method

In another method for manufacturing the light-emitting module according to an embodiment of the present invention, in the second step following the first step, without forming the sacrifice layer 1407 over the second electrode 1417, a first sealant 1405*b* which has an opening and surrounds the light-emitting element 1418 is formed on the surface of the second substrate 1404, over which the color filter 1434 and the light-blocking film are formed. The first substrate 1410 and the second substrate 1404 are attached to each other with the first sealant 1405*b* so that the light-emitting element 1418 is interposed therebetween (see FIGS. 6A and 6B).

In the following third step, a coating liquid layer containing a material which reacts with or adsorbs impurities is injected from the opening provided in the sealant 1405*b* to a space between the first substrate 1410 and the second substrate 1404.

In order to inject the coating liquid, the first substrate 1410 and the second substrate 1404 attached to each other may be placed in the environment in which the pressure is reduced, and the coating liquid may be introduced from the opening with a pressure higher than that in the above environment. Specifically, a method in which the opening is immersed in the coating liquid in the environment with a reduced pressure and the pressure of the environment is gradually increased, a method in which a nozzle is inserted into the opening and the coating liquid is injected, and the like may be used.

Figure 6A:
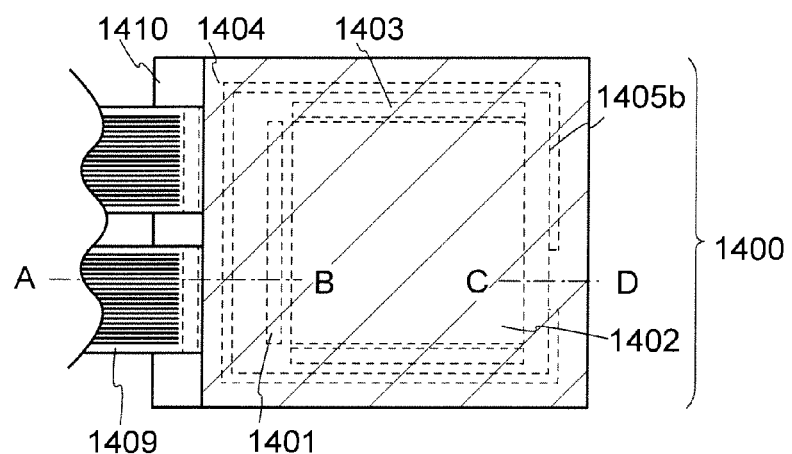
FIGS. 6A to 6C illustrate a method for manufacturing a light-emitting module and a light-emitting panel according to an embodiment.
Figure 6B:
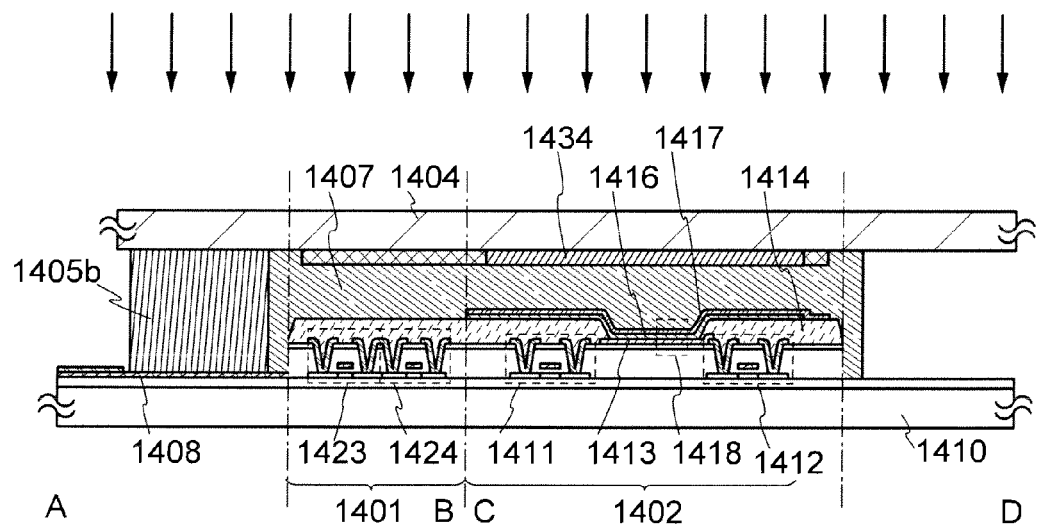
Figure 6C:
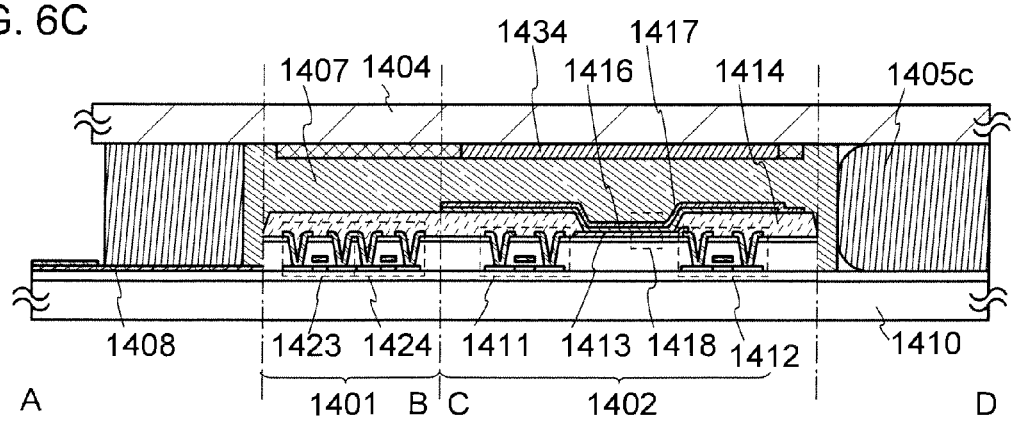

In the following fourth step, a second sealant 1415*c* is formed and the opening is filled therewith (see FIG. 6C). In the manufacturing method described above, the light-emitting module can be manufactured.

In accordance with the method for manufacturing a light-emitting module according to an embodiment of the present invention, the sacrifice layer can be formed in contact with the second electrode by a coating method (also referred to as a wet method). As a result, a method for manufacturing a highly reliable light-emitting module can be provided.

This embodiment can be combined with any of the other embodiments in this specification as appropriate.

Embodiment 4

In this embodiment, the structure of a light-emitting element which can be used for the light-emitting module according to an embodiment of the present invention will be described. Specifically, an example of the structure of a light-emitting element in which a layer containing a light-emitting organic compound is interposed between a pair of electrodes will be described with reference to FIGS. 7A to 7E. The light-emitting element can be applied to a light-emitting module including, between a first substrate and a second substrate, a first electrode provided over the first substrate, a second electrode provided over the first electrode with a layer containing a light-emitting organic compound interposed therebetween, and a sacrifice layer formed using a liquid material provided over the second electrode.

The light-emitting element described in this embodiment as an example includes a first electrode, a second electrode, and a layer containing a light-emitting organic compound (hereinafter referred to as an EL layer) provided between the first electrode and the second electrode. Note that one of the first electrode and the second electrode functions as an anode, and the other functions as a cathode. The EL layer is provided between the first electrode and the second electrode, and the structure of the EL layer may be appropriately selected in accordance with materials of the first electrode and second electrode. An example of the structure of the light-emitting element will be described below; however, it is needless to say that the structure of the light-emitting element is not limited to the example.

A material that can be used for an EL layer and is described in this embodiment as an example (one or more of a substance having a high hole-transport property, a light-emitting substance, a host material, a substance having a high electron-transport property, a substance having a high electron-injection property, an accepter substance, and the like) can be used for the sacrifice layer included in the light-emitting module according to an embodiment of the present invention. Impurities which reduce the reliability of the light-emitting element react with or are adsorbed by the material added to the sacrifice layer, which can also be used for the EL layer, and become inactive before reducing the reliability of the light-emitting element. As a result, a light-emitting module with high reliability can be provided.

Specific examples of the material which can be used for the sacrifice layer include a conductive high molecule, poly(3,4-ethylenedioxythiophene)/poly(styrenesulfonic acid) (PEDOT/PSS), 4,4'-bis[N-(1-naphthyl)-N-phenylamino]biphenyl (abbreviation: NPB or α-NPD), and tris (8-quinolinolato)aluminum (abbreviation: Alq).

Structure Example 1 of Light-Emitting Element

Figure 7A:
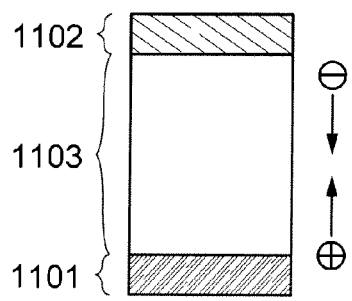
FIGS. 7A to 7E each illustrate a structure of a light-emitting element according to an embodiment.

An example of the structure of the light-emitting element is illustrated in FIG. 7A.

In the light-emitting element illustrated in FIG. 7A, an EL layer is provided between an anode 1101 and a cathode 1102.

When voltage higher than the threshold voltage of the light-emitting element is applied between the anode 1101 and the cathode 1102, holes are injected to the EL layer from the anode 1101 side and electrons are injected to the EL layer from the cathode 1102 side. The injected electrons and holes are recombined in the EL layer, so that a light-emitting substance contained in the EL layer emits light.

In this specification, a layer or a stacked body which includes one region where electrons and holes injected from both ends are recombined is referred to as a light-emitting unit. Therefore, it can be said that Structure Example 1 of the light-emitting element includes one light-emitting unit.

A light-emitting unit 1103 may include at least one light-emitting layer containing a light-emitting substance, and may have a structure in which the light-emitting layer and a layer other than the light-emitting layer are stacked. Examples of the layer other than the light-emitting layer are layers containing a substance having a high hole-injection property, a substance having a high hole-transport property, a substance having a poor hole-transport property (a substance which blocks holes), a substance having a high electron-transport property, a substance having a high electron-injection property, and a substance having a bipolar property (a substance having high electron- and hole-transport properties).

Figure 7B:
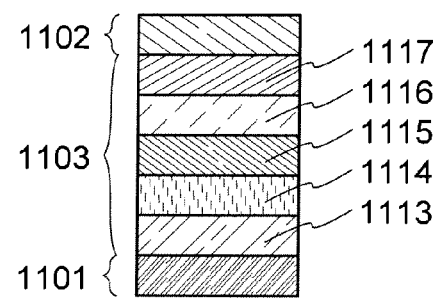

An example of a specific structure of the light-emitting unit 1103 is illustrated in FIG. 7B. In the light-emitting unit 1103 illustrated in FIG. 7B, a hole-injection layer 1113, a hole-transport layer 1114, a light-emitting layer 1115, an electron-transport layer 1116, and an electron-injection layer 1117 are stacked in that order from the anode 1101 side.

Structure Example 2 of Light-Emitting Element

Figure 7C:
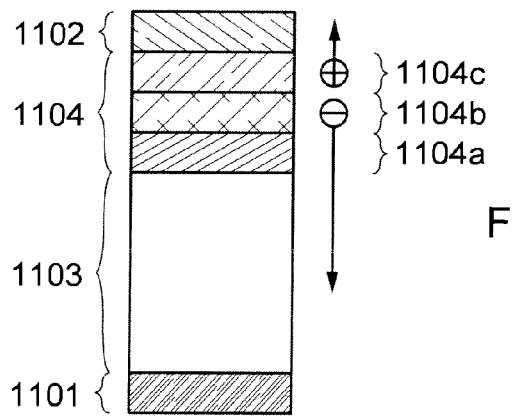

Another example of the structure of the light-emitting element is illustrated in FIG. 7C. In the light-emitting element illustrated in FIG. 7C, an EL layer including the light-emitting unit 1103 is provided between the anode 1101 and the cathode 1102.

Further, an intermediate layer 1104 is provided between the cathode 1102 and the light-emitting unit 1103. Note that a structure similar to that of the light-emitting unit included in Structure Example 1 of the light-emitting element, which is described above, can be applied to the light-emitting unit 1103 in Structure Example 2 of the light-emitting element and that the description of Structure Example 1 of the light-emitting element can be referred to for the details.

The intermediate layer 1104 may be formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in that order from the cathode 1102 side.

The behaviors of electrons and holes in the intermediate layer 1104 are described. When a voltage higher than the threshold voltage of the light-emitting element is applied between the anode 1101 and the cathode 1102, in the first charge generation region 1104c, holes and electrons are generated, and the holes are transferred to the cathode 1102 and the electrons are transferred to the electron-relay layer 1104b. The electron-relay layer 1104b has a high electron-transport property and immediately transfers the electrons generated in the first charge generation region 1104c to the electron-injection buffer 1104a. The electron-injection buffer 1104a can reduce a barrier against electron injection into the light-emitting unit 1103, so that the efficiency of the electron injection into the light-emitting unit 1103 can be improved. Thus, the electrons generated in the first charge generation region 1104c are injected into the LUMO level of the light-emitting unit 1103 through the electron-relay layer 1104b and the electron-injection buffer 1104a.

In addition, the electron-relay layer 1104b can prevent interaction in which the substance included in the first charge generation region 1104c and the substance included in the electron-injection buffer 1104a react with each other at the interface thereof and the functions of the first charge generation region 1104c and the electron-injection buffer 1104a are damaged.

The range of choices of materials that can be used for the cathode in Structure Example 2 of the light-emitting element is wider than that of materials that can be used for the cathode in Structure Example 1 of the light-emitting element. This is because the cathode in Structure Example 2 may receive holes generated by the intermediate layer and a material having a relatively high work function can be used.

Structure Example 3 of Light-Emitting Element

Figure 7D:
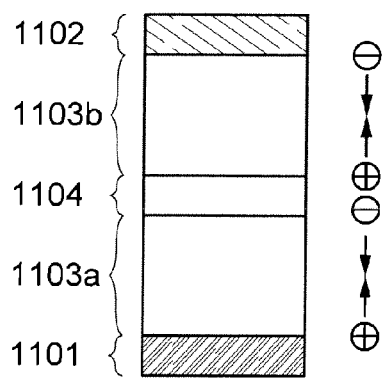
Figure 7E:
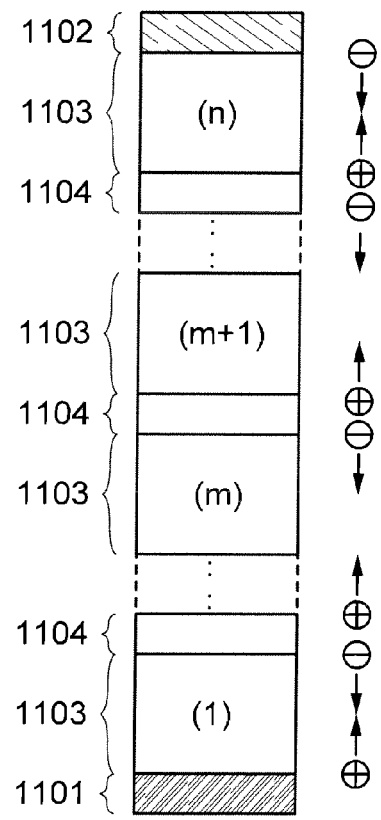

Another example of the structure of a light-emitting element is illustrated in FIG. 7D. In the light-emitting element illustrated in FIG. 7D, an EL layer including two light-emitting units is provided between the anode 1101 and the cathode 1102. Furthermore, the intermediate layer 1104 is provided between a first light-emitting unit 1103a and a second light-emitting unit 1103b.

Note that the number of the light-emitting units provided between the anode 1101 and the cathode 1102 is not limited to two. A light-emitting element illustrated in FIG. 7E has a structure in which a plurality of light-emitting units 1103 are stacked, that is, a so-called tandem structure. Note that in the case where n (n is a natural number of greater than or equal to 2) light-emitting units 1103 are provided between the anode and the cathode, the intermediate layer 1104 is provided between an m-th (m is a natural number of greater than or equal to 1 and less than or equal to n−1) light-emitting unit and an (m+1)-th light-emitting unit.

Note that a structure similar to that in Structure Example 1 of the light-emitting element can be applied to the light-emitting unit 1103 in Structure Example 3 of the light-emitting element; a structure similar to that in Structure Example 2 of the light-emitting element can be applied to the intermediate layer 1104 in Structure Example 3 of the light-emitting element. Thus, for the details, the description of the Structure Example 1 of the light-emitting element or the Structure Example 2 of the light-emitting element can be referred to.

The behavior of electrons and holes in the intermediate layer 1104 provided between the light-emitting units will be described. When voltage higher than the threshold voltage of the light-emitting element is applied between the anode 1101 and the cathode 1102, holes and electrons are generated in the intermediate layer 1104, and the holes are transferred to the light-emitting unit provided on the cathode 1102 side and the electrons are transferred to the light-emitting unit provided on the anode side. The holes injected into the light-emitting unit provided on the cathode side are recombined with the electrons injected from the cathode side, so that a light-emitting substance contained in the light-emitting unit emits light. The electrons injected into the light-emitting unit provided on the anode side are recombined with the holes injected from the anode side, so that a light-emitting substance contained in the light-emitting unit emits light. Thus, the holes and electrons generated in the intermediate layer 1104 cause light emission in the respective light-emitting units.

Note that in the case where a structure which is the same as the intermediate layer is formed between the light-emitting units by providing the light-emitting units in contact with each other, the light-emitting units can be formed to be in contact with each other. Specifically, when one surface of the light-emitting unit is provided with a charge generation region, the charge generation region functions as a first charge generation region of the intermediate layer; thus, the light-emitting units can be provided in contact with each other.

The Structure Examples 1 to 3 of the light-emitting element can be implemented in combination. For example, an intermediate layer can be provided between the cathode and the n-th light-emitting unit in Structure Example 3 of the light-emitting element.

<Material for Light-Emitting Element>

Next, specific materials that can be used for the light-emitting element having the above-described structure are described. Materials for the anode, the cathode, the EL layer, the charge generation region, the electron-relay layer, and the electron-injection buffer are described in that order.

<Material for Anode>

The anode 1101 is preferably formed using a metal, an alloy, an electrically conductive compound, a mixture of these materials, or the like which has a high work function (specifically, a work function of higher than or equal to 4.0 eV is preferable). Specifically, for example, indium tin oxide (ITO), indium tin oxide containing silicon or silicon oxide, indium zinc oxide (IZO), indium oxide containing tungsten oxide and zinc oxide, and the like are given.

Such conductive metal oxide films are usually formed by a sputtering method, but may also be formed by application of a sol-gel method or the like. For example, an indium-zinc oxide film can be formed by a sputtering method using a target in which zinc oxide is added at greater than or equal to 1 wt % and less than or equal to 20 wt % to indium oxide. A film of indium oxide containing tungsten oxide and zinc oxide can be formed by a sputtering method using a target in which tungsten oxide and zinc oxide are added at greater than or equal to 0.5 wt % and less than or equal to 5 wt % and greater than or equal to 0.1 wt % and less than or equal to 1 wt %, respectively, to indium oxide.

Besides, as a material used for the anode 101, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like. Alternatively, a conductive polymer such as poly(3,4-ethylenedioxythiophene)/poly(styrenesulfonic acid) (PEDOT/PSS) or polyaniline/poly(styrenesulfonic acid) (PAni/PSS) may be used.

Note that in the case where a second charge generation region is provided in contact with the anode 1101, a variety of conductive materials can be used for the anode 1101 regardless of their work functions. Specifically, besides a material which has a high work function, a material which has a low work function can also be used for the anode 1101. A material for forming the second charge generation region will be described later together with a material for forming the first charge generation region.

<Material for Cathode>

In the case where the first charge generation region 1104c is provided between the cathode 1102 and the light-emitting unit 1103 to be in contact with the cathode 1102, a variety of conductive materials can be used for the cathode 1102 regardless of their work functions.

Note that at least one of the cathode 1102 and the anode 1101 is formed using a conductive film that transmits visible light. For the conductive film that transmits visible light, for example, indium oxide containing tungsten oxide, indium zinc oxide containing tungsten oxide, indium oxide containing titanium oxide, indium tin oxide containing titanium oxide, indium tin oxide, indium zinc oxide, and indium tin oxide to which silicon oxide is added can be given. Further, a metal thin film having a thickness enough to transmit light (preferably, approximately greater than or equal to 5 nm and less than or equal to 30 nm) can also be used.

<Material for EL Layer>

Specific examples of materials for the layers included in the light-emitting unit 1103 will be given below.

The hole-injection layer is a layer containing a substance having a high hole-injection property. As the substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine (abbreviation: $H_2Pc$) or copper phthalocyanine (abbreviation: CuPc), a high molecule such as poly(3,4-ethylenedioxythiophene)/poly(styrenesulfonic acid) (PEDOT/PSS), or the like to form the hole-injection layer.

Note that the second charge generation region may be used instead of the hole-injection layer. When the second charge generation region is used, a variety of conductive materials can be used for the anode 1101 regardless of their work functions as described above. A material for forming the second charge generation region will be described later together with a material for forming the first charge generation region.

<Hole-Transport Layer>

The hole-transport layer is a layer containing a substance having a high hole-transport property. The hole-transport layer is not limited to a single layer, and may be a stack of two or more layers each containing a substance having a high hole-transport property. The hole-transport layer contains any substance having a higher hole-transport property than an electron-transport property, and preferably contains a substance having a hole mobility of higher than or equal to $10^{-6}$ cm$^2$/V·s because the driving voltage of the light-emitting element can be reduced.

Examples of the substance having a high hole-transport property include aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4-phenyl-4'-(9-phenylfluoren-9-yl)triphenylamine (abbreviation: BPAFLP), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluorene-2-yl)-N-phenylamino]biphenyl (abbreviation: BSPB). Examples further include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like. Examples further include carbazole derivatives such as 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyephenyl]-9H-carbazole (abbreviation: CzPA).

In addition to the above substances, a high molecular compound such as poly(N-vinylcarbazole) (abbreviation: PVK), poly(4-vinyltriphenylamine) (abbreviation: PVTPA), poly[N-(4-{N'[4-(4-diphenylamino)phenyl]phenyl-N'-phenylamino}phenyl)methacrylami de] (abbreviation: PTPDMA), or poly[N,N'-bis(4-butylphenyl)-N,N'-bis(phenyebenzidine] (abbreviation: Poly-TPD) can be used for the hole-transport layer.

<Light-Emitting Layer>

The light-emitting layer contains a light-emitting substance. The light-emitting layer is not limited to a single layer, and may be a stack of two or more layers containing light-emitting substances. As the light-emitting substance, a fluorescent compound or a phosphorescent compound can be used. A phosphorescent compound is preferably used as the light-emitting substance because the emission efficiency of the light-emitting element can be increased.

Examples of a fluorescent compound that can be used as the light-emitting substance include N,N'-bis[4-(9H-carbazol-9-yephenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryetriphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N'-triphenyl-1,4-phenyle nediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA). N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and SD1 (product name; manufactured by SFC Co., Ltd).

Examples of the phosphorescent compound that can be used as the light-emitting substance include bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: Flrpic), bis[2-(3',5'-bistrifluoromethylphenyl)pyridinato-N,C$^{2'}$]iridium(III)picolinate (abbreviation: [Ir(CF$_3$ppy)$_2$(pic)]), bis[2-(4',6'-difluorophenyl)pyridinato-N,C$^{2'}$]iridium(III) acetylacetonate (abbreviation: FIracac), tris(2-phenylpyridinato)iridium(III) (abbreviation: [Ir(ppy)$_3$]), bis(2-phenylpyridinato)iridium(III) acetylacetonate (abbreviation: [Ir(ppy)$_2$(acac)]), bis(benzo[h]quinolinato)iridium (III) acetylacetonate (abbreviation: [Ir(bzq)$_2$(acac)]), bis(2,4-diphenyl-1,3-oxazolato-N,C$^{2'}$)iridium(III) acetylacetonate (abbreviation: [Ir(dpo)$_2$(acac)]), bis{2-[4'-(perfluorophenyl)phenyl]pyridinato-N,C$^{2'}$}iridium(III) acetylacetonate (abbreviation: [Ir(p-PF-ph)$_2$(acac)]), bis(2-phenylbenzothiazolato-N,C$^{2'}$)iridium(III)acetylacetonate (abbreviation: [Ir(bt)$_2$(acac)]), bis[2-(2'-benzo[4,5-α]thienyl)pyridinato-N,C$^{3'}$] iridium(acetylacetonate) (abbreviation: [Ir(btp)$_2$(acac)]), bis(1-phenylisoquinolinato-N,C$^{2'}$)iridium(III)acetylacetonate (abbreviation: [Ir(piq)$_2$(acac)]), (acetylacetonato)bis[2,3-bis(4-fluorophenyl)quinoxalinato]iridium(III) (abbreviation: [Ir(Fdpq)$_2$(acac)]), (acetylacetonato)bis(2,3,5-triphenylpyrazinato)iridium(III) (abbreviation: [Ir(tppr)$_2$(acac)]), 2,3,7,8,12,13,17,18-octaethyl-21H,23H-porphineplatinum (II) (abbreviation: PtOEP, tris(acetylacetonato)(monophenanthroline)terbium (III) (abbreviation: Tb(acac)$_3$(Phen)), tris(1,3-diphenyl-1,3-propanedionato) (monophenanthroline)europium(III) (abbreviation: Eu(DBM)$_3$(Phen)), tris[1-(2-thenoyl)-3,3,3-trifluoroacetonato](monophenanthroline)europium(III) (abbreviation: Eu(TTA)$_3$(Phen)), and bis(2,3,5-triphenylpyrazinato) iridium(III) (abbreviation: [Ir(tppr)$_2$(dpm)]).

Note that those light-emitting substances are preferably dispersed in a host material. A host material preferably has higher excitation energy than the light-emitting substance.

As a material which can be used as the host material, it is possible to use an aromatic amine compound such as NPB (abbreviation), TPD (abbreviation), TCTA (abbreviation), TDATA (abbreviation), MTDATA (abbreviation), or BSPB (abbreviation); or a carbazole derivative such as PCzPCA1 (abbreviation). PCzPCA2 (abbreviation), PCzPCN1 (abbreviation), CBP (abbreviation), TCPB (abbreviation), CzPA (abbreviation), 9-phenyl-3-[4-(10-phenyl-9-anthryl)phenyl]-9H-carbazole (abbreviation: PCzPA), or 4-phenyl-4'-(9-phenyl-9H-carbazol-3-yl)triphenylamine (abbreviation: PCBA1BP). Alternatively, it is possible to use a substance which has a high hole-transport property and contains a high molecular compound, such as PVK (abbreviation), PVTPA (abbreviation), PTPDMA (abbreviation), or Poly-TPD (abbreviation). Alternatively, it is possible to use a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq). Alternatively, it is possible to use a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$). Further alternatively, it is possible to use a substance having a high electron-transport property, such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]carbazole (abbreviation: CO11), 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP).

<Electron-Transport Layer>

The electron-transport layer is a layer that contains a substance having a high electron-transport property. The electron-transport layer is not limited to a single layer, and may be a stack of two or more layers each containing a substance having a high electron-transport property. The electron-transport layer contains any substance having a higher electron-transport property than a hole-transport property, and preferably contains a substance having an electron mobility of higher than or equal to $10^{-6}$ cm$^2$/V·s because the driving voltage of the light-emitting element can be reduced.

As the substance having a high electron-transport property, for example, a metal complex having a quinoline skeleton or a benzoquinoline skeleton, such as Alq (abbreviation), Almq$_3$ (abbreviation), BeBq$_2$ (abbreviation), or BAlq (abbreviation), or the like can be used. Alternatively, a metal complex having an oxazole-based or thiazole-based ligand, such as Zn(BOX)$_2$ (abbreviation) or Zn(BTZ)$_2$ (abbreviation), or the like can be used. Further alternatively, PBD (abbreviation), OXD-7 (abbreviation), CO11 (abbreviation), TAZ (abbreviation), BPhen (abbreviation), BCP (abbreviation), 2-[4-(dibenzothiophen-4-yl)phenyl]-1-phenyl-1H-benzimidazole (abbreviation: DBTBIm-II), or the like can be used.

Besides the above-described substances, a high molecular compound such as poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can be used for the electron-transport layer.

<Electron-Injection Layer>

The electron-injection layer is a layer that contains a substance having a high electron-injection property. The electron-injection layer is not limited to a single layer, and may be a stack of two or more layers containing substances having a high electron-injection property. The electron-injection layer is preferably provided because the efficiency of electron injection from the cathode 1102 can be increased and the driving voltage of the light-emitting element can be reduced.

As the substance having a high electron-injection property, the following can be given: an alkali metal, an alkaline earth metal, and a compound thereof, such as lithium (Li), cesium (Cs), calcium (Ca), lithium fluoride (LiF), cesium fluoride (CsF), and calcium fluoride (CaF$_2$). Alternatively, a layer containing a substance having an electron-transport property and an alkali metal, an alkaline earth metal, magnesium (Mg), or a compound thereof (e.g., an Alq layer containing magnesium (Mg)) can be used.

<Material for Charge Generation Region>

The first charge generation region 1104c and the second charge generation region are regions containing a substance having a high hole-transport property and an acceptor substance. The charge generation region may not only include a substance having a high hole-transport property and an acceptor substance in the same film but may include a stack of a layer containing a substance having a high hole-transport property and a layer containing an acceptor substance. Note that in the case where the first charge production region which is in contact with the cathode has a layered structure, the layer containing the substance having a high electron-transport property is in contact with the cathode 1102. In the case where the second charge generation region which is in contact with the anode has a layered structure, the layer containing the acceptor substance is in contact with the anode 1101.

Note that the acceptor substance is preferably added to the charge generation region so that the mass ratio of the acceptor substance to the substance having a high hole-transport property is from 0.1:1 to 4.0:1.

As the acceptor substance that is used for the charge generation region, a transition metal oxide, particularly an oxide of a metal belonging to Group 4 to Group 8 of the periodic table is preferred. Specifically, molybdenum oxide is particularly preferable. Note that molybdenum oxide has a low hygroscopic property.

As the substance having a high hole-transport property used for the charge generation region, any of a variety of organic compounds such as an aromatic amine compound, a carbazole derivative, an aromatic hydrocarbon, and a high molecular compound (including an oligomer, a dendrimer, or a polymer) can be used. Specifically, a substance having a hole mobility of higher than or equal to $10^{-6}$ cm$^2$/Vs is preferably used. However, other substances than the above-described substances may also be used as long as the substances have higher hole-transport properties than electron-transport properties.

<Material for Electron-Relay Layer>

The electron-relay layer 1104b is a layer that can immediately receive electrons drawn out by the acceptor substance in the first charge generation region 1104c. Therefore, the electron-relay layer 1104b is a layer containing a substance having a high electron-transport property, and the LUMO level thereof is positioned between the acceptor level of the acceptor substance in the first charge generation region 1104c and the LUMO level of the light-emitting unit 1103. Specifically, the LUMO level of the electron-relay layer 1104b is preferably higher than or equal to −5.0 eV and lower than or equal to −3.0 eV.

As the substance used for the electron-relay layer 1104b, for example, a perylene derivative and a nitrogen-containing condensed aromatic compound can be given. Note that a nitrogen-containing condensed aromatic compound is preferably used for the electron-relay layer 1104b because of its stability. Among nitrogen-containing condensed aromatic compounds, a compound having an electron-withdrawing group such as a cyano group or fluorine is preferably used because such a compound further facilitates acceptance of electrons in the electron-relay layer 1104b.

As specific examples of the perylene derivative, the following can be given: 3,4,9,10-perylenetetracarboxylic dianhydride (abbreviation: PTCDA), 3,4,9,10-perylenetetracarboxylic bisbenzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

Besides, 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluorophthalocyanine (abbreviation: F$_{16}$CuPc), N,N'-bis(2,2,3,3,4,4,5,5,6,6,7,7,8,8-pentadecafluorooctyl)-1,4,5,8-naphthalenetetracarboxylic diimide (abbreviation: NTCDI-C8F), 3',4'-dibutyl-5,5"-bis(dicyanomethylene)-5,5"-dihydro-2,2':5',2"-terthiophen (abbreviation: DCMT), methanofullerenes (e.g., [6,6]-phenyl C$_{61}$ butyric acid methyl ester), or the like can be used for the electron-relay layer 1104b.

<Material for Electron-Injection Buffer>

The electron-injection buffer 1104a is a layer which facilitates electron injection from the first charge generation region 1104c into the light-emitting unit 1103. By providing the electron-injection buffer 1104a between the first charge generation region 1104c and the light-emitting unit 1103, the injection barrier therebetween can be reduced.

A substance having a high electron-injection property can be used for the electron-injection buffer 1104a. For example, an alkali metal, an alkaline earth metal, a rare earth metal, or a compound thereof (e.g., an alkali metal compound (including an oxide such as lithium oxide, a halide, and carbonate such as lithium carbonate or cesium carbonate), an alkaline earth metal compound (including an oxide, a halide, and carbonate), or a rare earth metal compound (including an oxide, a halide, and carbonate)) can be used.

Further, in the case where the electron-injection buffer 1104a contains a substance having a high electron-transport property and a donor substance, the donor substance is preferably added so that the mass ratio of the donor substance to the substance having a high electron-transport property is greater than or equal to 0.001:1 and less than or equal to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, and a compound of the above metal (e.g., an alkali metal compound (including an oxide of lithium oxide or the like, a halide, and carbonate such as lithium carbonate or cesium carbonate), an alkaline earth metal compound (including an oxide, a halide, and carbonate), and a rare earth metal compound (including an oxide, a halide, and carbonate). Note that as the substance having a high electron-transport property, a material similar to the above material for the electron-transport layer which can be formed in part of the light-emitting unit 1103 can be used.

<Method for Manufacturing Light-Emitting Element>

An embodiment of a method for manufacturing a light-emitting element is described. Over the first electrode, the layers described above are combined as appropriate to form an EL layer. Any of a variety of methods (e.g., a dry process or a wet process) can be used to form the EL layer depending on the material for the EL layer. For example, a vacuum evaporation method, an inkjet method, a spin coating method, or the like may be selected. Note that a different formation method may be employed for each layer. A second electrode is formed over the EL layer. In the above manner, the light-emitting element is manufactured.

The light-emitting element described in this embodiment can be manufactured by combination of the above-described materials. Light emission from the above-described light-emitting substance can be obtained with this light-emitting element, and the emission color can be selected by changing the type of the light-emitting substance.

Further, a plurality of light-emitting substances which emit light of different colors can be used, whereby, for example, white light emission can also be obtained by expanding the width of the emission spectrum. Note that in order to obtain white light emission, for example, a structure may be employed in which at least two layers containing light-emitting substances are provided so that light of complementary colors from each other is emitted. Specific examples of complementary colors include "blue and yellow", "blue-green and red", and the like.

Further, in order to obtain white light emission with an excellent color rendering property, an emission spectrum preferably spreads through the entire visible light region. For example, a light-emitting element may include layers emitting light of blue, green, and red.

This embodiment can be combined with any of the other embodiments in this specification as appropriate.

Embodiment 5

In this embodiment, a passive matrix light-emitting device according to an embodiment of the present invention will be described. Specifically, a passive matrix light-emitting device including a light-emitting panel provided with a plurality of light-emitting modules will be described with reference to FIGS. 8A and 8B. The light-emitting modules each include, between a first substrate and a second substrate, a first electrode provided over the first substrate, a second electrode provided over the first electrode with a layer containing a light-emitting organic compound interposed therebetween, and a sacrifice layer formed using a liquid material provided over the second electrode.

The light-emitting module included in the passive matrix light-emitting device according to an embodiment of the present invention has a structure including the sacrifice layer in contact with the second electrode. The sacrifice layer contains a material which reacts with or adsorbs impurities (such as water and/or oxygen) and is formed by a coating method (also referred to as a wet method). Impurities which reduce the reliability of the light-emitting element preferentially react with or are preferentially adsorbed by the material contained in the sacrifice layer and become inactive. As a result, the reliability of the light-emitting module can be improved, and a highly reliable passive matrix light-emitting device can be provided.

The light-emitting module has a structure in which the second electrode having a light-transmitting property and the second substrate having a light-transmitting property are optically connected by the sacrifice layer. Accordingly, a drastic change in the refractive index (also referred to as a step portion in the refractive index) of light of the light-emitting element can be suppressed in a light path from the second electrode to the second substrate, whereby light of the light-emitting element can be efficiently extracted to the second substrate through the second electrode. As a result, the emission efficiency of the light-emitting module can improved, and a highly reliable passive matrix light-emitting device can be provided.

In the light-emitting module provided in the passive matrix light-emitting device according to an embodiment of the present invention, stray light is suppressed owing to the thin sacrifice layer over the partition. As a result, the emission efficiency of the light-emitting module can be improved, and a light-emitting device with high reliability can be provided.

<Passive Matrix Light-Emitting Device>

Figure 8A:
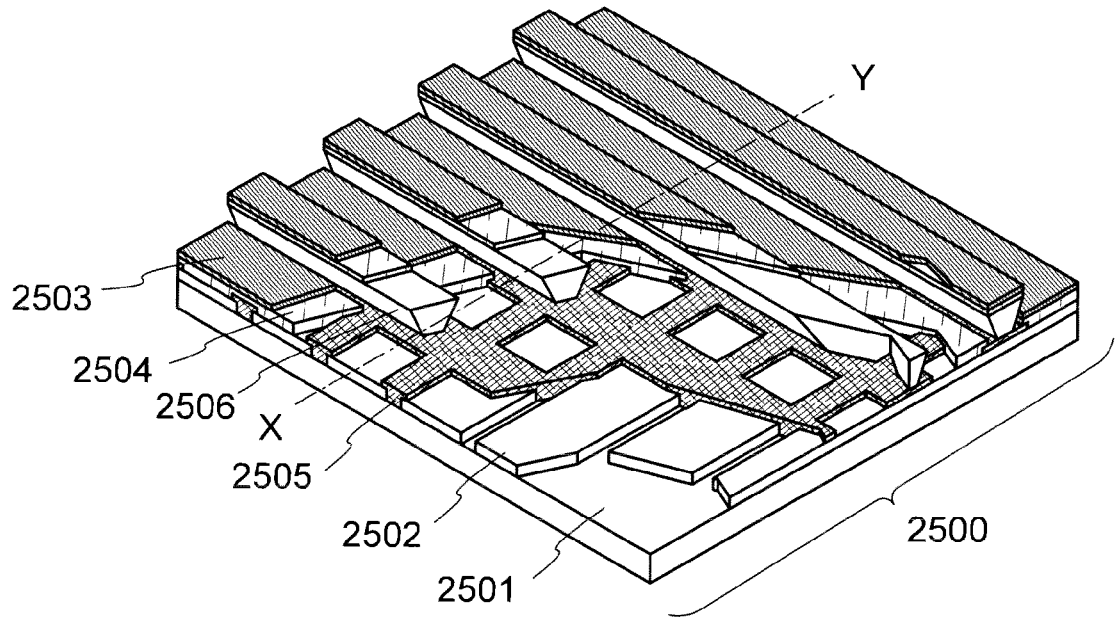
FIGS. 8A and 8B illustrate a structure of a light-emitting device according to an embodiment.
Figure 8B:
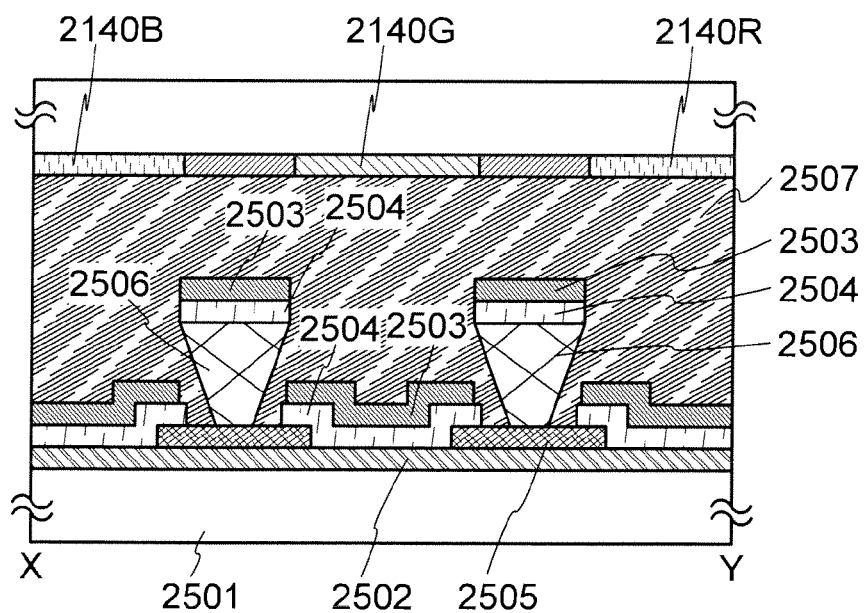

Then, a structure in which the light-emitting module according to an embodiment of the present invention is applied to a passive matrix light-emitting device is illustrated in FIGS. 8A and 8B. Note that FIG. 8A is a perspective view of the light-emitting device and FIG. 8B is a cross-sectional view of a cross section taken along X-Y in FIG. 8A.

A passive matrix light-emitting device 2500 includes a first electrode 2502 over a substrate 2501. Further, an insulating layer 2505 is provided so as to cover an end portion of the first electrode 2502, and a partition layer 2506 is provided over the insulating layer 2505.

Further, a color filter 2140R which transmits red light, a color filter 2140G which transmits green light, and a color filter 2140B which transmits blue light are provided over their respective light-emitting elements.

In the light-emitting device 2500, a second electrode 2503 is provided over the first electrode 2502, and a layer 2504 containing a light-emitting organic compound is provided between the first electrode 2502 and the second electrode 2503, so that the light-emitting element is formed. As a structure of the light-emitting element, for example, the structure of the light-emitting element exemplified in Embodiment 4 can be employed. In addition, a sacrifice layer 2507 is provided over the second electrode 2503.

In addition, the light-emitting module included in the light-emitting device exemplified in this embodiment includes the light-emitting element including the layer containing a light-emitting organic compound which emits white light between the pair of electrodes and the color filter overlapping with the light-emitting element.

Sidewalls of the partition layer 2506 slope so that the distance between one sidewall and the other sidewall gradually decreases toward the surface of the substrate. In other words, a cross section taken along the direction of the short side of the partition layer 2506 is trapezoidal, and the base (side parallel to the plane of the insulating layer 2505 and in contact with the insulating layer 2505) is shorter than the upper side (side parallel to the plane of the insulating layer 2505 and not in contact with the insulating layer 2505). With the partition layer 2506 provided as described above, a defect of the light-emitting element due to crosstalk or the like can be prevented.

This embodiment can be combined with any of the other embodiments in this specification as appropriate.

Embodiment 6

In this embodiment, electronic devices according to an embodiment of the present invention will be described. Specifically, electronic devices each including a light-emitting panel provided with a plurality of light-emitting modules will be described with reference to FIGS. 9A to 9E. The light-emitting modules each include, between a first substrate and a second substrate, a first electrode provided over the first substrate, a second electrode provided over the first electrode with a layer containing a light-emitting organic compound interposed therebetween, and a sacrifice layer formed using a liquid material provided over the second electrode.

The light-emitting module included in the electronic device according to an embodiment of the present invention has a structure including the sacrifice layer in contact with the second electrode. The sacrifice layer contains a material which reacts with or adsorbs impurities (such as water and/or oxygen) and is formed by a coating method (also referred to as a wet method). Accordingly, impurities which reduce the reliability of the light-emitting element preferentially react with or are preferentially adsorbed by the material contained in the sacrifice layer and become inactive. As a result, the reliability of the light-emitting module can be improved, and a highly reliable electronic device can be provided.

The light-emitting module has a structure in which the second electrode having a light-transmitting property and the second substrate having a light-transmitting property are optically connected by the sacrifice layer. Accordingly, a drastic change in the refractive index (also referred to as a step portion in the refractive index) of light of the light-emitting element can be suppressed in a light path from the second electrode to the second substrate, whereby light of the light-emitting element can be efficiently extracted to the second substrate through the second electrode. As a result, the emission efficiency of the light-emitting module can be improved, and a highly reliable electronic device can be provided.

In the light-emitting module provided in the electronic device according to an embodiment of the present invention, stray light is suppressed owing to the thin sacrifice layer over the partition. As a result, the emission efficiency of the light-emitting module can be improved, and a highly reliable electronic device can be provided.

Examples of the electronic devices to which the light-emitting device is applied include television sets (also referred to as televisions or television receivers), monitors of computers or the like, cameras such as digital cameras or digital video cameras, digital photo frames, mobile phone sets (also referred to as mobile phones or mobile phone devices), portable game machines, portable information terminals, audio reproducing devices, large-sized game machines such as pachinko machines, and the like. Specific examples of these electronic devices are shown in FIGS. 9A to 9E.

Figure 9A:
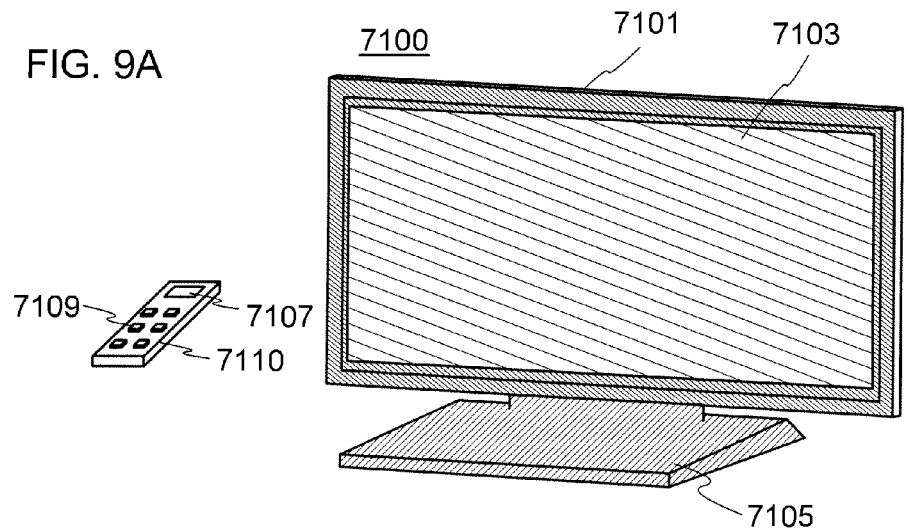
FIGS. 9A to 9E each illustrate an example of an electronic device according to an embodiment.

FIG. 9A illustrates an example of a television set. In a television set 7100, a display portion 7103 is incorporated in a housing 7101. Images can be displayed by the display portion 7103, and the light-emitting device can be used for the display portion 7103. In addition, here, the housing 7101 is supported by a stand 7105.

The television set 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television set 7100 is provided with a receiver, a modem, and the like. With the receiver, general television broadcasts can be received. Moreover, when the display device is connected to a communication network with or without wires via the modem, one-way (from a sender to a receiver) or two-way (between a sender and a receiver or between receivers) data communication can be performed.

Figure 9B:
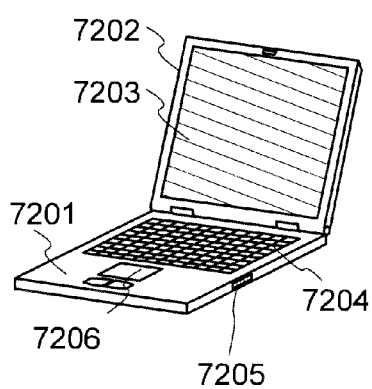

FIG. 9B illustrates a computer, which includes a main body 7201, a housing 7202, a display portion 7203, a keyboard 7204, an external connection port 7205, a pointing device 7206, and the like. This computer is manufactured by using a light-emitting device for the display portion 7203.

Figure 9C:
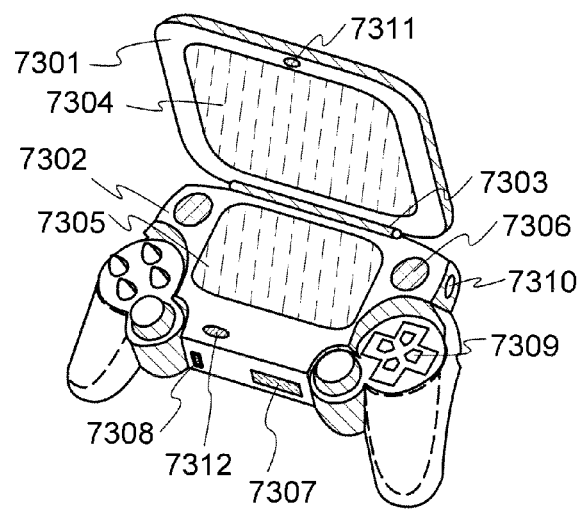

FIG. 9C illustrates a portable game machine, which includes two housings, i.e., a housing 7301 and a housing 7302, connected to each other via a joint portion 7303 so that the portable game machine can be opened or closed. A display portion 7304 is incorporated in the housing 7301 and a display portion 7305 is incorporated in the housing 7302. In addition, the portable game machine illustrated in FIG. 9C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, tilt angle, vibration, smell, or infrared rays), or a microphone 7312), and the like.

It is needless to say that the structure of the portable game machine is not limited to the above as long as the light-emitting device is used for at least either the display portion 7304 or the display portion 7305, or both of them. The portable game machine may be provided with other accessories as appropriate. The portable game machine in FIG. 9C has a function of reading a program or data stored in a recording medium to display it on the display portion, and a function of sharing data with another portable game machine by wireless communication. The portable game machine in FIG. 9C can have various functions without being limited to this example.

Figure 9D:
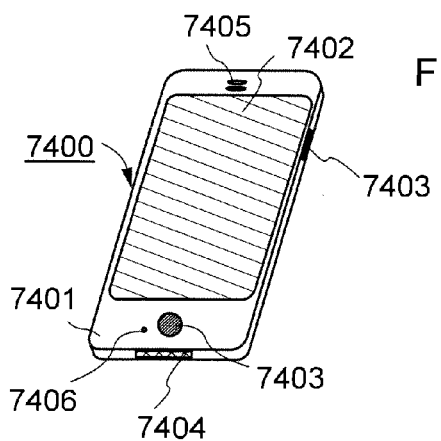

FIG. 9D illustrates an example of a mobile phone set. The mobile phone set 7400 is provided with a display portion 7402 incorporated in a housing 7401, an operation button 7403, an external connection port 7404, a speaker 7405, a microphone 7406, and the like. Note that the mobile phone set 7400 is manufactured using a light-emitting device for the display portion 7402.

When the display portion 7402 of the mobile phone set 7400 illustrated in FIG. 9D is touched with a finger or the like, data can be input to the mobile phone set 7400. Further, operations such as making a call and composing an e-mail can be performed by touching the display portion 7402 with a finger or the like.

There are mainly three screen modes for the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be input. In that case, it is preferable to display a keyboard or number buttons on almost all the area of the screen of the display portion 7402.

When a detection device including a sensor for detecting inclination, such as a gyroscope or an acceleration sensor, is provided inside the mobile phone set 7400, display on the screen of the display portion 7402 can be automatically changed by determining the orientation of the mobile phone set 7400 (whether the mobile phone set is placed horizontally or vertically for a landscape mode or a portrait mode).

The screen modes are switched by touching the display portion 7402 or operating the operation button 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touching the display portion 7402 with the palm or the finger, whereby personal authentication can be performed. Further, by providing a backlight or a sensing light source which emits a near-infrared light in the display portion, an image of a finger vein, a palm vein, or the like can be taken.

Figure 9E:
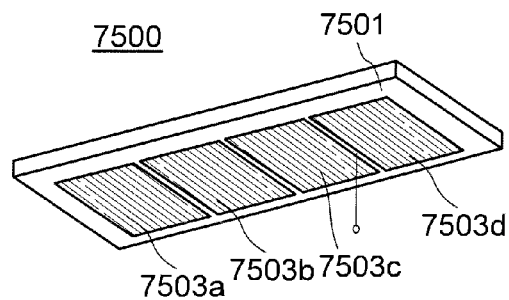

FIG. 9E illustrates an example of a lighting device. In a lighting device 7500, light-emitting devices 7503a to 7503d of an embodiment of the present invention are incorporated in a housing 7501 as light sources. The lighting device 7500 can be attached to a ceiling, a wall, or the like.

The light-emitting device of an embodiment of the present invention includes a light-emitting panel in a thin film form. Thus, when the light-emitting device is attached to a base with a curved surface, a light-emitting device with a curved surface can be obtained. In addition, when the light-emitting device is located in a housing with a curved surface, an electronic device or a lighting device with a curved surface can be obtained.

This embodiment can be combined with any of the other embodiments in this specification as appropriate.

EXPLANATION OF REFERENCE

100: light-emitting panel, 106a: conductive layer, 106b: conductive layer, 107: insulating layer, 110: substrate, 120: substrate, 121a: optical filter, 121b: optical filter, 123: light-blocking layer, 125: overcoat layer, 130: sacrifice layer, 140: partition, 150a: light-emitting module, 150b: light-emitting module, 151a: electrode, 151b: electrode, 152a: electrode, 152b: electrode, 153a: layer containing light-emitting organic compound, 153b: layer containing light-emitting organic compound, 154a: light-emitting element, 154b:

light-emitting element, 1101: anode, 1102: cathode, 1103: light-emitting unit, 1103*a*: light-emitting unit, 1103*b*: light-emitting unit, 1104: intermediate layer, 1104*a*: electron injection buffer, 1104*b*: electron-relay layer, 1104*c*: charge generation region, 1113: hole injection layer, 1114: hole transport layer, 1115: light-emitting layer, 1116: electron-transport layer, 1117: electron-injection layer, 1400: light-emitting device, 1401: source driver circuit, 1402: pixel portion, 1403: gate driver circuit, 1404: substrate, 1405: sealant, 1405*b*: sealant, 1407: sacrifice layer, 1408: wiring, 1410: substrate, 1411: transistor, 1412: transistor, 1413: electrode, 1414: partition, 1415*c*: sealant, 1416: layer containing light-emitting organic compound, 1417: electrode, 1418: light-emitting element, 1423: n-channel transistor, 1424: p-channel transistor, 1433: spacer, 1434: color filter, 1435: film, 2140B: color filter, 2140G: color filter, 2140R: color filter, 2500: light-emitting device, 2501: substrate, 2502: electrode, 2503: electrode, 2505: insulating layer, 2506: partition layer, 2507: sacrifice layer, 7100: television set, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7301: housing, 7302: housing, 7303: joint portion, 7304: display portion, 7305: display portion, 7306: speaker portion, 7307: recording medium insertion portion, 7308: LED lamp, 7309: operation key, 7310: connection terminal, 7311: sensor, 7312: microphone, 7400: mobile phone set, 7401: housing, 7402: display portion, 7403: operation button, 7404: external connection port, 7405: speaker, 7406: microphone, 7500: lighting device, 7501: housing, 7503*a*: light-emitting device, 7503*b*: light-emitting device, 7504*c*: light-emitting device, 7503*d*: light-emitting device This application is based on Japanese Patent Application serial No. 2011-151685 filed with Japan Patent Office on Jul. 8, 2011, the entire contents of which are hereby incorporated by reference.

What is claimed is:

1. An electronic device comprising:
a first substrate;
a second substrate facing the first substrate;
a light-emitting element between the first substrate and the second substrate, wherein the light-emitting element includes a first electrode over the first substrate, a second electrode overlapping with the first electrode, and a layer containing a light-emitting organic compound between the first electrode and the second electrode;
a partition covering an end portion of the first electrode, the partition including an opening overlapping with the first electrode; and
a layer containing a liquid crystal material over the second electrode and the partition,
wherein the layer containing the liquid crystal material is surrounded by a sealant.

2. The electronic device according to claim 1, wherein the sealant comprises an epoxy-based resin.

3. The electronic device according to claim 1, wherein the sealant is between the first substrate and the second substrate.

4. The electronic device according to claim 1, wherein the first substrate or the second substrate is a glass substrate.

5. The electronic device according to claim 1, wherein the light-emitting element has a top emission structure.

6. The electronic device according to claim 1, further comprising a color filter over the layer containing the liquid crystal material.

7. The electronic device according to claim 1, wherein the electronic device is one of a television, a computer, a digital camera, and a mobile phone.

8. The electronic device according to claim 1,
wherein the layer containing the liquid crystal material comprises a first region which overlaps with the partition and a second region which overlaps with the opening, and
wherein a thickness of the first region is smaller than a thickness of the second region.

9. An electronic device comprising:
a first substrate;
a second substrate facing the first substrate;
a light-emitting element between the first substrate and the second substrate, wherein the light-emitting element includes a first electrode over the first substrate, a second electrode overlapping with the first electrode, and a layer containing a light-emitting organic compound between the first electrode and the second electrode;
a partition covering an end portion of the first electrode, the partition including an opening overlapping with the first electrode; and
a layer containing a liquid crystal material over the second electrode and the partition,
wherein the layer containing the liquid crystal material is surrounded by a sealant,
wherein a flexible printed circuit is outside the sealant, and
wherein a transistor which overlaps with the layer containing the liquid crystal material is on a same surface as a wiring connected to the flexible printed circuit.

10. The electronic device according to claim 9, wherein the sealant comprises an epoxy-based resin.

11. The electronic device according to claim 9, wherein the sealant is between the first substrate and the second substrate.

12. The electronic device according to claim 9, wherein the first substrate or the second substrate is a glass substrate.

13. The electronic device according to claim 9, wherein the light-emitting element has a top emission structure.

14. The electronic device according to claim 9, further comprising a color filter over the layer containing the liquid crystal material.

15. The electronic device according to claim 9, wherein the electronic device is one of a television, a computer, a digital camera, and a mobile phone.

16. The electronic device according to claim 9,
wherein the layer containing the liquid crystal material comprises a first region which overlaps with the partition and a second region which overlaps with the opening, and
wherein a thickness of the first region is smaller than a thickness of the second region.

* * * * *